United States Patent
Haiberger et al.

(10) Patent No.: US 9,876,148 B2
(45) Date of Patent: Jan. 23, 2018

(54) ELECTRONIC COMPONENT, OPTOELECTRONIC COMPONENT, COMPONENT ARRANGEMENT, AND METHOD FOR PRODUCING AN ELECTRONIC COMPONENT

(71) Applicant: OSRAM Opto Semiconductors GmbH, Regensburg (DE)

(72) Inventors: Luca Haiberger, Regensburg (DE); Matthias Sperl, Mintraching (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/502,188

(22) PCT Filed: Aug. 4, 2015

(86) PCT No.: PCT/EP2015/067911
§ 371 (c)(1),
(2) Date: Feb. 6, 2017

(87) PCT Pub. No.: WO2016/020365
PCT Pub. Date: Feb. 11, 2016

(65) Prior Publication Data
US 2017/0222094 A1 Aug. 3, 2017

(30) Foreign Application Priority Data
Aug. 5, 2014 (DE) .................. 10 2014 111 106

(51) Int. Cl.
*H01L 21/00* (2006.01)
*H01L 33/48* (2010.01)
(Continued)

(52) U.S. Cl.
CPC ............ *H01L 33/486* (2013.01); *H01L 24/96* (2013.01); *H01L 33/0095* (2013.01);
(Continued)

(58) Field of Classification Search
CPC .................... H05B 2203/023; H01L 21/76254
See application file for complete search history.

(56) References Cited

U.S. PATENT DOCUMENTS

| | | | |
|---|---|---|---|
| 6,953,708 B2 | 10/2005 | Hedler et al. | |
| 7,858,440 B2 | 12/2010 | Pressel et al. | |
| (Continued) | | | |

FOREIGN PATENT DOCUMENTS

| | | |
|---|---|---|
| DE | 10239866 B3 | 4/2004 |
| DE | 202005009086 U1 | 11/2005 |
| DE | 102008039388 A1 | 4/2009 |
| DE | 102012102420 A1 | 9/2013 |
| EP | 0328088 A2 | 8/1989 |
| JP | 2012243462 A | 12/2012 |
| WO | 2013118002 A1 | 8/2013 |

*Primary Examiner* — Zandra Smith
*Assistant Examiner* — Andre' C Stevenson
(74) *Attorney, Agent, or Firm* — Slater Matsil, LLP

(57) ABSTRACT

An electronic component, an optoelectronic component, a component arrangement, and a method for producing an electronic component are disclosed. In an embodiment, the method includes forming a sacrificial structure on a top side of a carrier by a photolithographic process from a photoresist layer, arranging an electronic semiconductor chip on the carrier after exposing the photoresist layer, molding a molded body around the sacrificial structure and around the electronic semiconductor chip such that a surface of the electronic semiconductor chip is at least partly not covered by the molded body, detaching the molded body from the carrier and removing the sacrificial structure, wherein removing the sacrificial structure results in a cutout being formed in the molded body.

12 Claims, 14 Drawing Sheets

(51) Int. Cl.
*H01L 33/00* (2010.01)
*H01L 33/54* (2010.01)
*H01L 33/62* (2010.01)
*H01L 23/00* (2006.01)
*H01L 21/56* (2006.01)

(52) U.S. Cl.
CPC .............. *H01L 33/54* (2013.01); *H01L 33/62* (2013.01); *H01L 21/568* (2013.01); *H01L 2224/04105* (2013.01); *H01L 2224/18* (2013.01); *H01L 2924/1301* (2013.01); *H01L 2924/13091* (2013.01); *H01L 2924/1815* (2013.01); *H01L 2933/0033* (2013.01)

(56) References Cited

U.S. PATENT DOCUMENTS

| | | |
|---|---|---|
| 9,276,183 B2 | 3/2016 | Gruendl et al. |
| 2006/0262533 A1 | 11/2006 | Lin et al. |
| 2011/0037155 A1* | 2/2011 | Pagaila ................ H01L 21/561 |
| | | 257/686 |
| 2012/0056228 A1 | 3/2012 | Horng et al. |
| 2012/0056229 A1 | 3/2012 | Hsu |
| 2013/0049039 A1 | 2/2013 | Vadhavkar |
| 2015/0325742 A1* | 11/2015 | Liu .................... H01L 33/0079 |
| | | 438/33 |

* cited by examiner

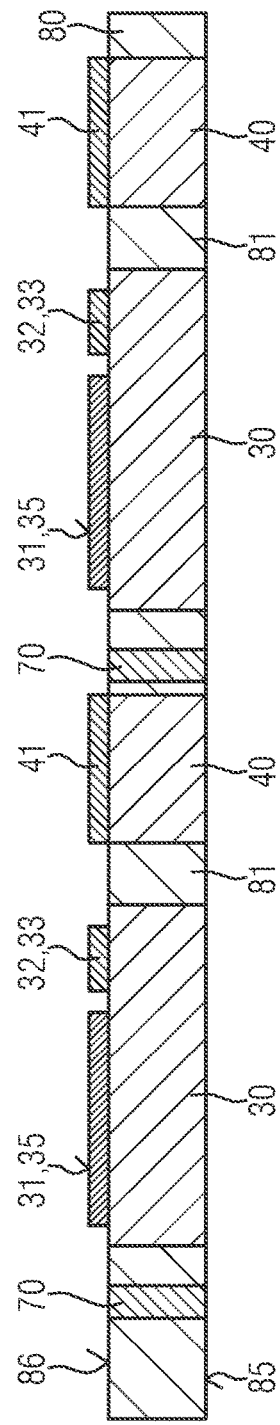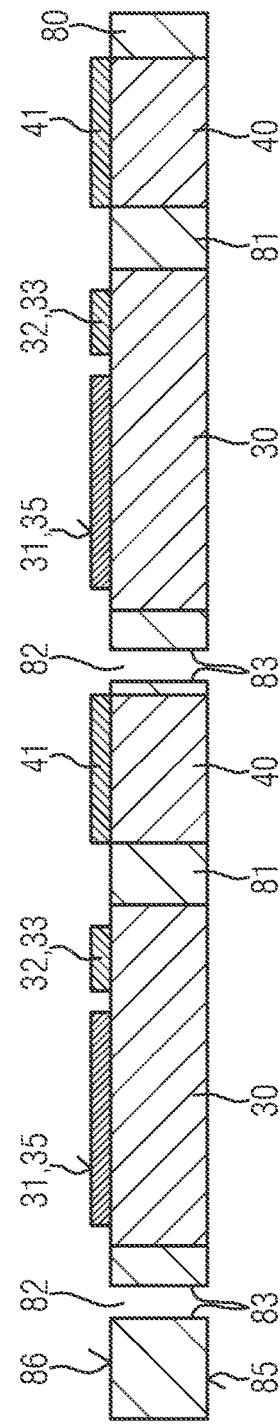

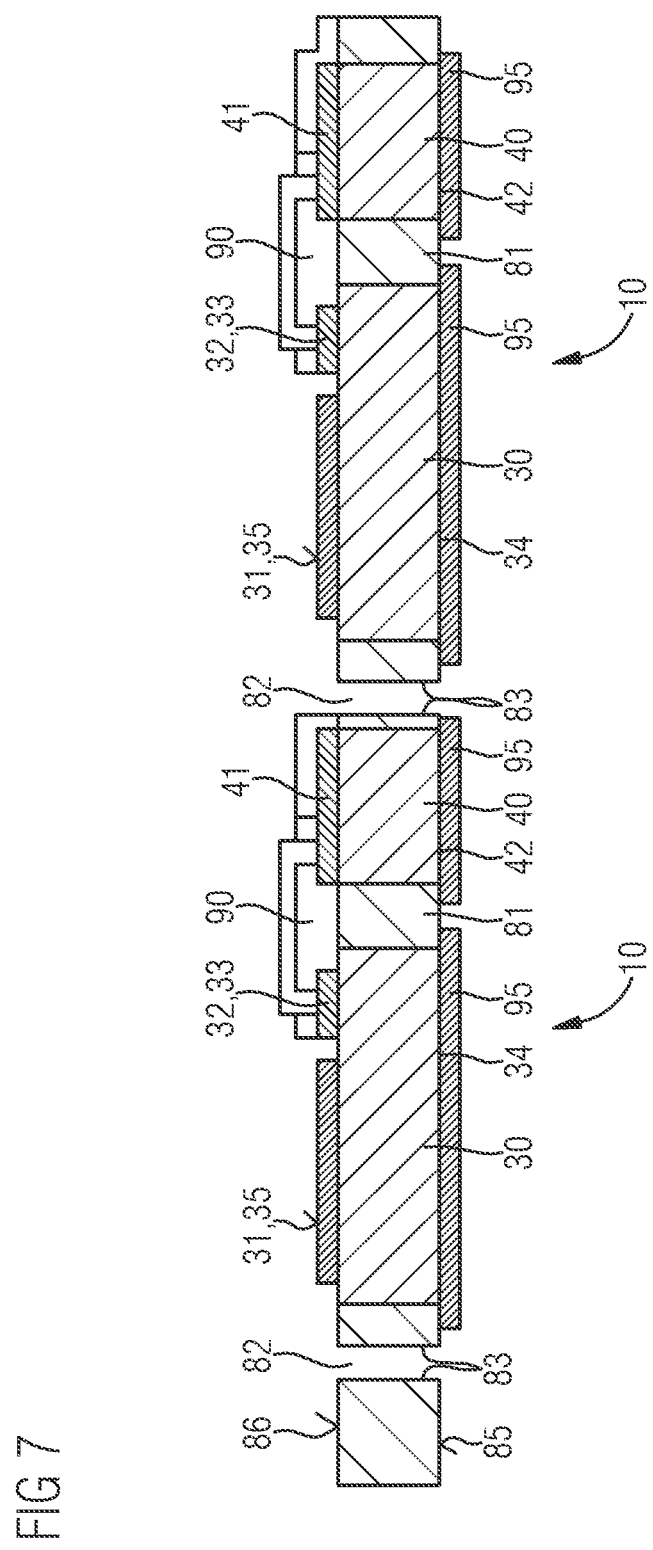

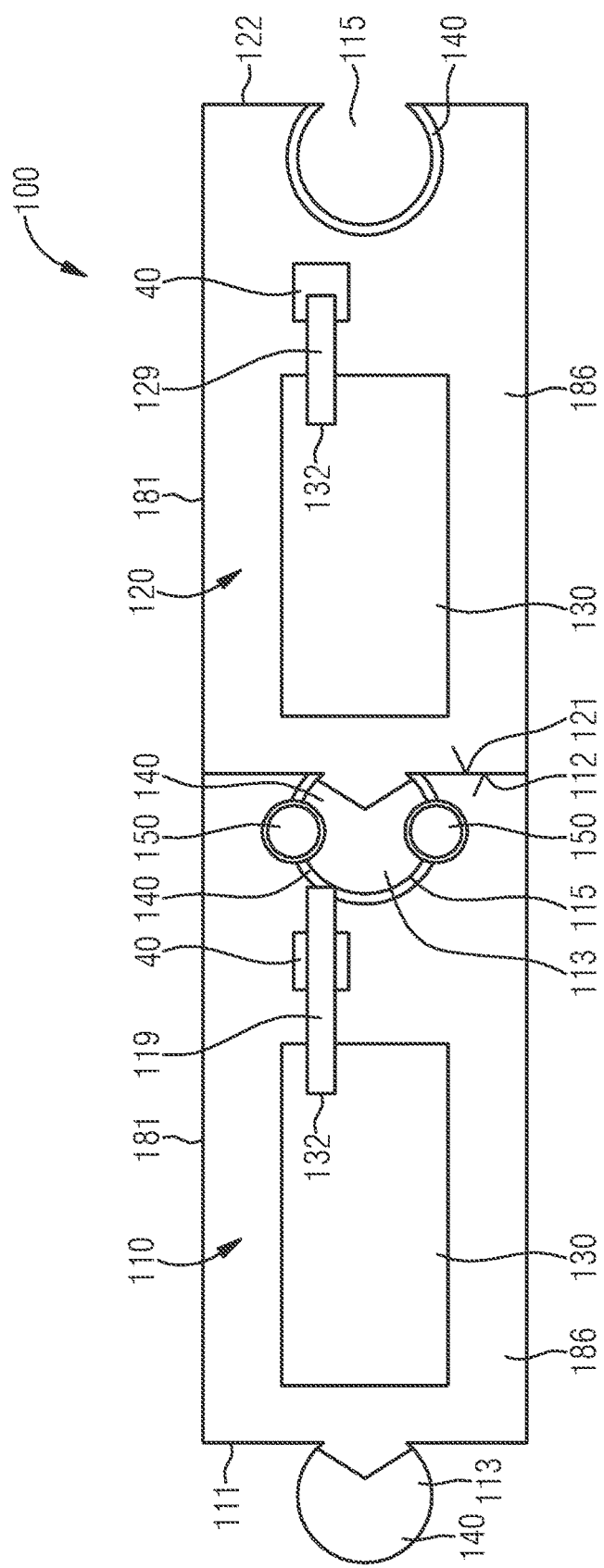

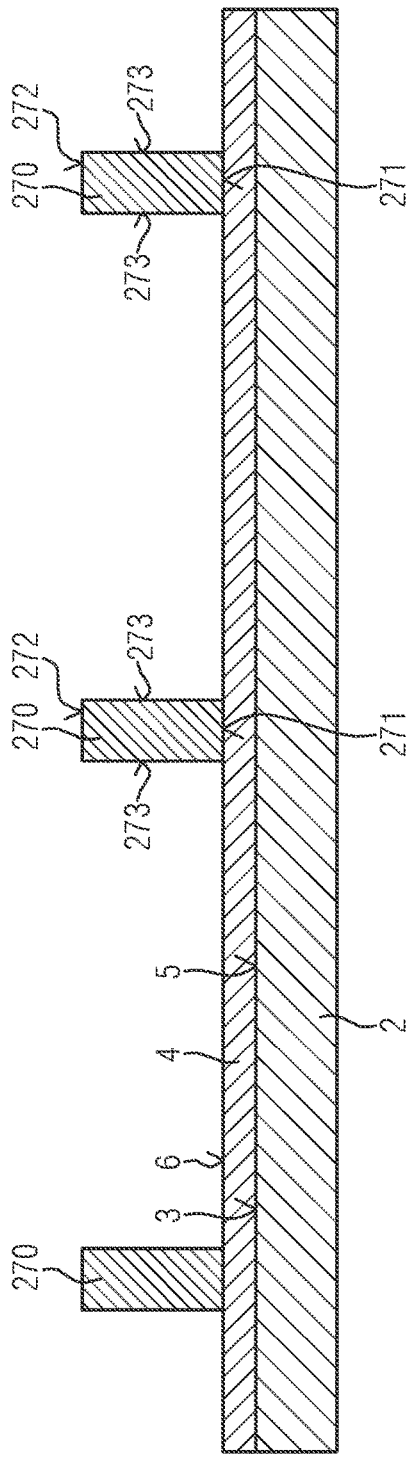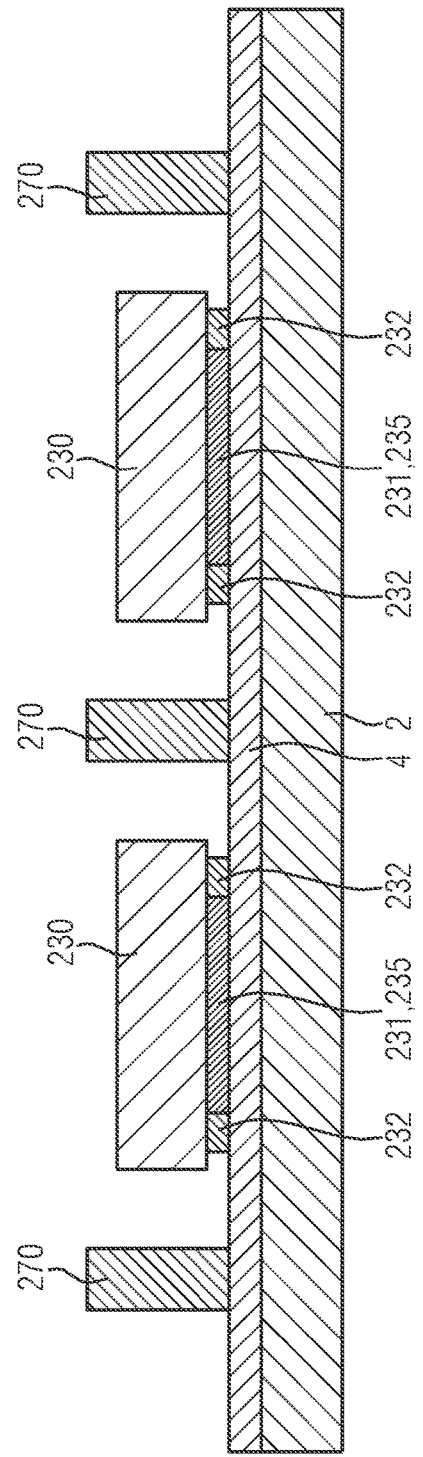

ELECTRONIC COMPONENT, OPTOELECTRONIC COMPONENT, COMPONENT ARRANGEMENT, AND METHOD FOR PRODUCING AN ELECTRONIC COMPONENT

This patent application is a national phase filing under section 371 of PCT/EP2015/067911, filed Aug. 4, 2015, which claims the priority of German patent application 10 2014 111 106.0, filed Aug. 5, 2014, each of which is incorporated herein by reference in its entirety.

TECHNICAL FIELD

The present invention relates to a method for producing an electronic component, an electronic component, an optoelectronic component and a component arrangement.

BACKGROUND

The prior art discloses electronic components comprising an electronic semiconductor chip arranged in a housing. In this case, during the production of the electronic component, the electronic semiconductor chip may be embedded into a molded body in such a way that a surface of the electronic semiconductor chip remains free. As a result, the electronic component may be mounted such that the surface of the electronic semiconductor chip is in direct contact with a heat sink. This facilitates the dissipation of heat loss from the electronic component.

If the electronic component is an optoelectronic component comprising an optoelectronic semiconductor chip, a part of the exposed surface or the entire exposed surface may be an optically active surface of the optoelectronic semiconductor chip, for example, an emission face.

SUMMARY OF THE INVENTION

Embodiments of the invention provide a method for producing an electronic component. Further embodiments of the invention provide an electronic component, a component arrangement and an optoelectronic component.

In various embodiments, a method for producing an electronic component comprises molding a molded body around a sacrificial structure arranged on a top side of a carrier and around an electronic semiconductor chip in such a way that a surface of the electronic semiconductor chip is at least partly not covered by the molded body. As further steps, the method comprises detaching the molded body from the carrier and removing the sacrificial structure, wherein removing the sacrificial structure results in a cutout being formed in the molded body.

By molding the molded body around the sacrificial structure and removing the sacrificial structure later, it is possible to produce a cutout in the molded body in an advantageously simple and cost-saving manner. By way of example, oval cutouts or undercuts may be produced. If the sacrificial structure has a large aspect ratio of height to width, deep and narrow cutouts may advantageously be produced in the molded body.

By virtue of the fact that the surface of the electronic semiconductor chip is at least partly not covered by the molded body, the surface of the electronic semiconductor chip remains accessible, such that, for example, heat loss may be dissipated from the electronic semiconductor chip via the surface.

In one development of the method, the electronic semiconductor chip is an optoelectronic semiconductor chip and the surface is an emission face of the optoelectronic semiconductor chip. Since the emission face of the optoelectronic semiconductor chip is kept free of the molded body, the emission of the optoelectronic semiconductor chip is advantageously not impaired by the molded body.

The sacrificial structure is formed from a photoresist by means of a photolithographic process. The use of a photolithographic process advantageously allows a microscopic structuring of the cutout produced in the molded body. If a photoresist that makes it possible to produce high freestanding structures is used for the photolithographic process, deep and narrow cutouts may advantageously be produced in the molded body.

In one development of the method, an electrically conductive layer is applied on at least one wall face of the cutout. The cutout may lead through the electronic component, for example. The electrically conductive layer then advantageously enables a conductive connection between two sides of the component.

In one development of the method, a connection element is arranged on the molded body, which connection element electrically conductively connects the electrically conductive layer to a contact pad of the electronic semiconductor chip. The electrically conductive layer on the wall face of the cutout may then advantageously be used for contacting the electronic semiconductor chip. As a result, for example, a contacting of the electronic semiconductor chip from only one side of the electronic component is possible.

In one development of the method, the latter comprises severing the molded body and the cutout produced in the molded body. As a result, the wall face of the cutout may form an outer face of the electronic component. Curved outer faces of the electronic component may advantageously be produced by means of a suitable structuring of the sacrificial structure and thus of the cutout. If an electrically conductive layer is applied on a wall face of the cutout, then a simple contacting of the component from outside is possible, for example, by soldering.

In one development of the method, the cutout is formed in a manner adjoining the surface of the electronic semiconductor chip. As a result, a molded body may advantageously be produced in the case of which the surface of the electronic semiconductor chip is arranged in a depression of the molded body and is accessible from outside. The depression may advantageously be filled with a wavelength-converting material.

In one development of the method, firstly the sacrificial structure is arranged on the top side of the carrier and then the electronic semiconductor chip is arranged on a top side of the sacrificial structure. In this case, the surface of the electronic semiconductor chip faces the sacrificial structure. As a result, the sacrificial structure may be formed before equipping the carrier. This is particularly advantageous when using a photolithographic process for forming the sacrificial structure. As a result of the arrangement of the electronic semiconductor chip on the sacrificial structure, a cutout adjoining the surface of the electronic semiconductor chip may be produced in the molded body in a simple and cost-effective manner.

In one development of the method, the sacrificial structure is arranged on the surface of the electronic semiconductor chip. Then the sacrificial structure and the electronic semiconductor chip are arranged on the top side of the carrier. By virtue of the fact that the sacrificial structure is firstly arranged or formed on the electronic semiconductor chip, for instance by means of a photolithographic method, the sacrificial structure and the electronic semiconductor chip may advantageously be aligned with one another particularly precisely.

In one development of the method, the cutout is formed in a manner adjoining a side face of the electronic semiconductor chip. As a result, a thermally conductive and/or radiation-transmitting material may advantageously also be applied on the side face. Said material is advantageous particularly when using electronic semiconductor chips which comprise an optoelectronic volume emitter.

In one development of the method, the electronic semiconductor chip is partly embedded into the sacrificial structure. As a result, a cutout which adjoins both a surface and a side face of the electronic semiconductor chip may be produced in the molded body in a particularly simple and cost-effective manner.

In one development of the method, the sacrificial structure is formed by means of a photolithographic process from a photoresist system comprising a first photoresist layer and a second photoresist layer. In this case, the electronic semiconductor chip is pressed into the second photoresist layer. This makes it possible for a cutout which adjoins both a surface and a side face of the electronic semiconductor chip to be produced in the molded body in a simple and cost-effective manner.

In one development of the method, in a further method step, a potting compound is introduced into the cutout. If the potting compound comprises a thermally conductive material, it is thus possible to achieve a particularly efficient and rapid dissipation of heat from the electronic semiconductor chip. If the electronic semiconductor chip is an optoelectronic semiconductor chip, the potting compound may comprise a transparent or, for example, wavelength-converting material. As a result, an advantageously high color homogeneity and luminous efficiency of the light emitted by the semiconductor chip may be achieved.

In one development of the method, a peg is formed through the cutout on a first side face of the electronic component and a groove matching the peg is formed on a second side face of the electronic component. This allows the connection of a plurality of electronic components of identical type in a simple manner and makes it possible to realize small component spacings. Moreover, circuit boards and corresponding populating processes may be dispensed with for the connection of the components.

In one development of the method, the electronic component is produced together with further electronic components in a molded body assemblage. In this case, the method comprises, as an additional method step, separating the electronic component from the further electronic components by dividing the molded body assemblage. As a result, a plurality of electronic components which comprise a molded body comprising a cutout may be produced in a simple and cost-saving manner.

In various other embodiments an electronic component comprises an electronic semiconductor chip and a molded body. In this case, the molded body covers at least one side face of the electronic semiconductor chip. A surface of the electronic semiconductor chip is at least partly not covered by the molded body. Furthermore, the molded body comprises a first side face with a peg and a second side face with a groove matching the peg.

By means of the peg and the groove, the electronic component may be connected in a simple manner to other electronic components configured in an identical fashion by means of the peg of the electronic component being arranged in a manner engaging into a groove of a further electronic component.

In one development of the electronic component, a contact structure on the groove and/or on the peg is formed in an electrically conductive fashion. As a result, two electronic components formed in this way may advantageously be connected both mechanically and electrically by means of the peg of one component being arranged in a manner engaging into the groove of the other component and the electrically conductive contact structures on the groove and/or the peg being contacted.

In one development of the electronic component, the electrically conductive connecting face of the groove and/or of the peg is conductively connected to a contact pad of the electronic semiconductor chip via an electrically conductive connection element. As a result, the electronic semiconductor chip may advantageously be contacted via the electrically conductive connecting face on the groove and/or on the peg. Moreover, it is also possible to realize a series connection of a plurality of electronic semiconductor chips by means of the peg of one component in each case being arranged in a manner engaging into the groove of another component and the connecting faces on the groove and on the peg being connected.

In yet other embodiments a component arrangement comprises a first electronic component and a second electronic component, wherein the peg of the first electronic component is arranged in a manner engaging into the groove of the second electronic component. As a result, the first and second electronic components may be connected without further mechanical connection elements, for instance a circuit board, which advantageously enables small component spacings. It is also possible to easily exchange an electronic component in the component arrangement. Since no circuit boards or complex populating processes are necessary for connecting the components, the component arrangement may be produced in a cost-saving manner.

In one development of the component arrangement, the first electronic component and the second electronic component in each case comprise a contact structure. An electrically conductive connection is arranged on the component arrangement. In this case, the electrically conductive connection is conductively connected to the contact structures of the first electronic component and of the second electronic component. This allows a simple electrical contacting of the electronic components via the contact structures.

An optoelectronic component comprises an optoelectronic semiconductor chip and a molded body. The molded body at least partly covers a side face of the optoelectronic semiconductor chip, wherein an emission face of the optoelectronic semiconductor chip is at least partly not covered by the molded body. Furthermore, the molded body comprises a cutout, wherein the cutout adjoins a surface and the side face of the optoelectronic semiconductor chip. The optoelectronic semiconductor chip may be a volume emitter, for example, in which the emission face comprises both the surface and the side face. A high luminous efficiency of the optoelectronic component may be achieved by an arrangement of the cutout both on the surface and on the side face of the electronic semiconductor chip.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. In the figures, in each case in a schematic illustration:

FIG. 5 shows a sectional view of the first molded body assemblage after partly removing top sides of the first molded bodies;

FIG. 6 shows a sectional view of the first molded body assemblage after removing the first sacrificial structure;

FIG. 7 shows a sectional view of two first electronic components formed from the first molded body assemblage;

FIG. 9 shows a plan view of a component arrangement comprising two electronic components;

FIG. 10 shows a sectional view of the carrier with a second sacrificial structure arranged on said carrier;

FIG. 11 shows a sectional view of the carrier with third electronic semiconductor chips arranged on said carrier;

DETAILED DESCRIPTION OF ILLUSTRATIVE EMBODIMENTS

Figure 1:
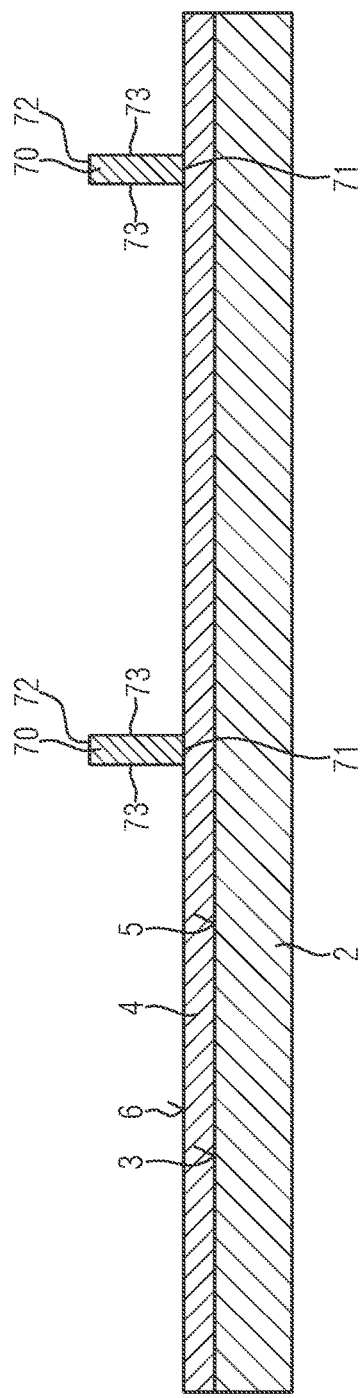
FIG. 1 shows a sectional view of a carrier with a first sacrificial structure arranged thereon.

FIG. 1 shows a schematic sectional illustration of a carrier 2 for producing electronic components. The carrier 2 may be formed, for example, in the form of a wafer as a thin slice and may comprise silicon, for example. However, the carrier 2 may also comprise a metal, a ceramic or some other material. The carrier 2 comprises a substantially planar top side 3.

Figure 2:
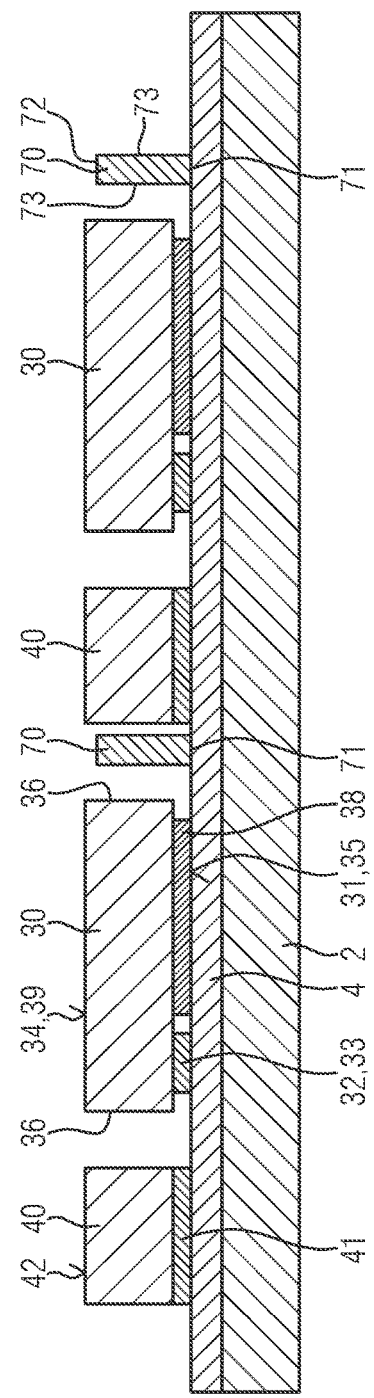
FIG. 2 shows a sectional view of the carrier with the first sacrificial structures and first electronic semiconductor chips.

A first sacrificial structure 70 is fixed on the top side 3 of the carrier 2 by means of an adhesion layer 4. The adhesion layer 4 may consist, for example, of a film comprising a thermally releasable adhesive layer on one side and a customary adhesive layer on the other side. In FIG. 2, the thermally releasable layer is arranged on a component side 6 of the adhesion layer 4 and in a manner facing the first sacrificial structure 70, while the customary adhesive layer is arranged on a carrier side 5 of the adhesion layer 4 facing the carrier 2. Instead of or alongside the thermally releasable adhesive layer, the adhesion layer 4 may also comprise an adhesive that is releasable by irradiation with light, for example, with UV light, an adhesive that is releasable by a wet-chemical treatment or an adhesive that is releasable by a laser treatment. The adhesive of the adhesion layer 4 may also be releasable by shear or tensile forces.

The adhesion layer 4 may optionally be omitted or be replaced by some other fixing means between the carrier 2 and the elements arranged on the top side 3 thereof. The adhesion layer 4 is in some instances not explicitly illustrated in the further description and the figures, but may always be present.

The first sacrificial structure 70 arranged on the top side 3 of the carrier 2 by means of the adhesion layer 4 may, as depicted, consist of a plurality of individual elements. Two elements of the first sacrificial structure 70 are illustrated in sectional view in FIG. 1.

The first sacrificial structure 70 is formed by a photolithographic method on the carrier 2. For this purpose, firstly a photoresist may be applied on the carrier 2; by way of example, the photoresist may be applied by spin-coating on the carrier 2. As a result, a substantially uniform and planar photoresist layer forms on the carrier 2. The photoresist is then exposed through a photomask. After the photoresist has been developed, depending on the process, either the exposed or the unexposed regions of the photoresist remain on the carrier 2 and form the first sacrificial structure 70.

Alternatively, the first sacrificial structure 70 may also firstly be produced on a separate carrier by means of a photolithographic method as described. The separate carrier may be formed like the carrier 2. The first sacrificial structure 70 may then be transferred to the top side 3 of the carrier 2. This may be done, for example, with the aid of an adhesive film on which the individual elements of the first sacrificial structure 70 are fixed before being detached from the separate carrier.

FIG. 2 shows the carrier 2 with the first sacrificial structure 70 arranged on the top side 3 in a method state temporally succeeding the illustration in FIG. 1. First electronic semiconductor chips 30 and through-contact elements 40 have additionally been arranged on the top side 3. Preferably, the first sacrificial structure 70 was formed such that its height measured perpendicularly to the top side 3 of the carrier 2 approximately corresponds to the corresponding height of the first electronic semiconductor chips 30 and the height of the through-contact elements 40. The first sacrificial structure 70 may comprise, for example, a height of 10 μm to 1 mm; it preferably comprises a height of a few 100 micrometers.

The first electronic semiconductor chips 30 may be formed as optoelectronic semiconductor chips, for example, as light emitting diode chips, laser chips, photovoltaic chips or photodiode chips. However, the electronic semiconductor chips 30 may also be formed as an electronic circuit comprising power semiconductor components, for example. These circuits may be configured, for example, to switch or to regulate high currents and voltages. By way of example, the circuits may comprise power diodes, thyristors, triacs or power transistors, for instance IGBTs or MOSFETs.

The first electronic semiconductor chips 30 illustrated in FIG. 2 have a surface 35. The first electronic semiconductor chips 30 are arranged on the top side 3 of the carrier 2 such that the surface 35 of the first electronic semiconductor chips 30 faces the top side 3 of the carrier 2. If optoelectronic semiconductor chips are involved, then the surface 35 may be formed completely or partly as a radiation-transmitting face. In the case of the electronic semiconductor chips 30, for example, a part of the surface 35 is configured as an emission face 31 which emits electromagnetic radiation. If the first electronic semiconductor chips are power semiconductor circuits, the surface 35 of the first electronic component 30 may be configured to dissipate heat loss from the circuit.

The first electronic semiconductor chips 30 comprise contact pads 32 comprising front-side contact pads 33 and rear-side contact pads 34. The front-side contact pads 33 are arranged on the surface 35 of the electronic semiconductor chips 30. The rear-side contact pads 34 are arranged on a base face 39 of the first electronic semiconductor chip 30 located opposite the surface 35.

The first electronic semiconductor chip 30 may be connected to an external circuit via the contact pads 32. By way of example, in the case of a light emitting diode chip for generating electromagnetic radiation, via the contact pads 32, a voltage may be applied to an optoelectronic and radiation-emitting layer structure. If the first electronic semiconductor chip 30 is configured as a purely electronic circuit, then transistors, for example, may be connected and controlled via the contact pads 32.

The through-contact elements 40 comprise an electrically conductive material, for example, a metal or a semiconductor material. By way of example, the through-contact elements 40 are composed of silicon. In a direction perpendicular to the top side 3 of the carrier 2, they preferably comprise the same height as the first electronic semiconductor chips 30. The through-contact elements 40 comprise a first contact pad 41 and a second contact pad 42, which are respectively arranged on opposite sides of the through-contact elements 40. The first contact pads 41 are arranged on a side of the through-contact elements 40 facing the carrier 2.

Preferably, the first electronic semiconductor chips 30, the through-contact elements 40 and the elements of the first sacrificial structure 70 are arranged in a manner spaced apart laterally on the carrier 2 and form a two-dimensional grid. In each case one of the first electronic semiconductor chips 30 and one of the through-contact elements 40 are arranged between two elements of the first sacrificial structure 70.

Figure 3:
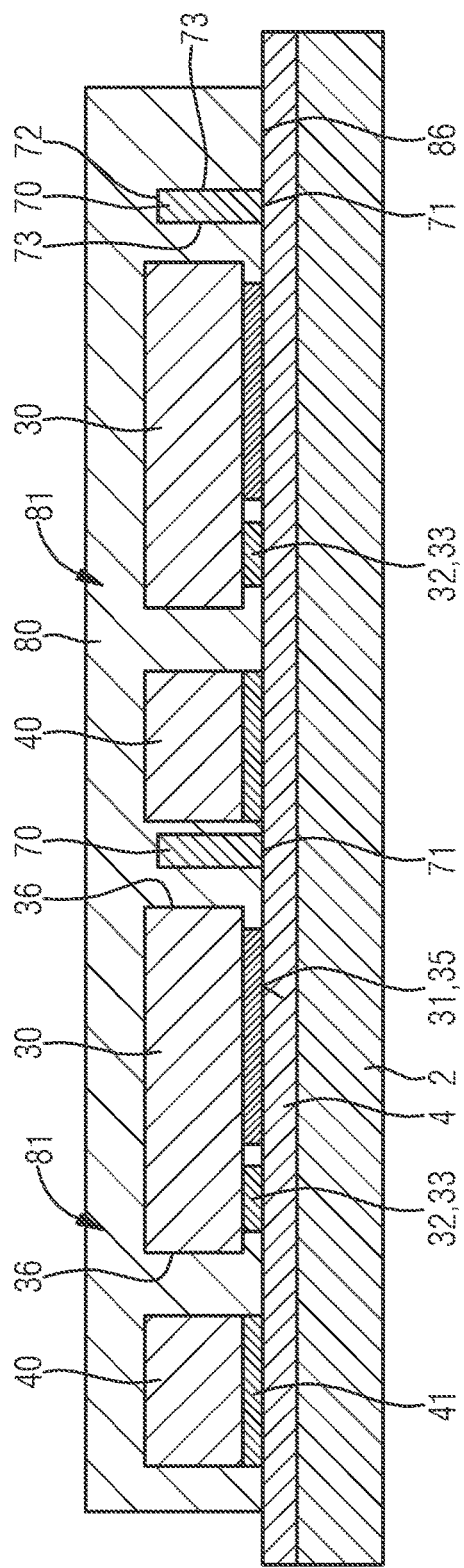
FIG. 3 shows a sectional view of the carrier with a first molded body assemblage comprising first molded bodies formed on said carrier.

FIG. 3 shows the carrier 2 in a method state succeeding the illustration in FIG. 2. First molded bodies 81 have been molded around the first sacrificial structure 70, the first electronic semiconductor chips 30 and the through-contacts 40. Here in each case one of the first molded bodies 81 molds around one of the first electronic semiconductor chips 30 and one of the through-contact elements 40. The elements of the first sacrificial structure 70 are arranged in each case at the edges of the first molded bodies 81. The first molded bodies 81 form a material-uniform first molded body assemblage 80. The first molded bodies 81 comprise front sides 86 and rear sides 85 located opposite the front sides. In this case, the front sides 86 face the top side 3 of the carrier 2.

The first molded body assemblage 80 comprising the first molded bodies 81 is preferably produced by means of an injection molding process, a transfer molding process or some other molding process. The first molded bodies 81 may be produced, for example, in a lamination apparatus or an apparatus for compression molding, transfer molding or injection molding methods. The first molded bodies 81 comprise an electrically insulating material. By way of example the first molded bodies 81 may comprise a thermoplastic such as PMMA, an epoxy resin or a silicone. If the first electronic semiconductor chips 30 are optoelectronic semiconductor chips, then the first molded bodies 81 preferably consist of a radiation-nontransmissive or opaque material.

The surfaces 35 of the first electronic semiconductor chips 30 facing the top side 3 of the carrier 2 are not covered by the first molded bodies 81 and terminate flush with the front sides 86 of the first molded bodies 81 facing the carrier 2. In particular, the parts of the surfaces 35 of the first electronic semiconductor chips 30 which form the emission faces 31 and the parts of said surfaces which form the front-side contact pads 33 are not covered by the first molded bodies 81. Equally, in each case a top side 71 of the first sacrificial structure 70 and the first contact pads 41 of the through-contacts 40 terminate flush with the front sides 86 of the first molded bodies 81 and are not covered by the first molded bodies 81.

The first molded body assemblage 80 comprising the first molded bodies 81 may, as illustrated in FIG. 3, be formed higher than the first electronic semiconductor chips 30, the through-contact elements 40 and the first sacrificial structure 70 in the direction perpendicular to the top side 3 of the carrier 2. The first molded bodies 81 then completely cover side faces 36 and the base faces 39 of the first electronic semiconductor chips 30. The first molded bodies 81 likewise completely cover side faces 73 and undersides 72 of the first sacrificial structures 70. The first molded bodies 81 likewise cover side faces 43 and the second contact pads 42 of the through-contact elements 40.

Figure 4:
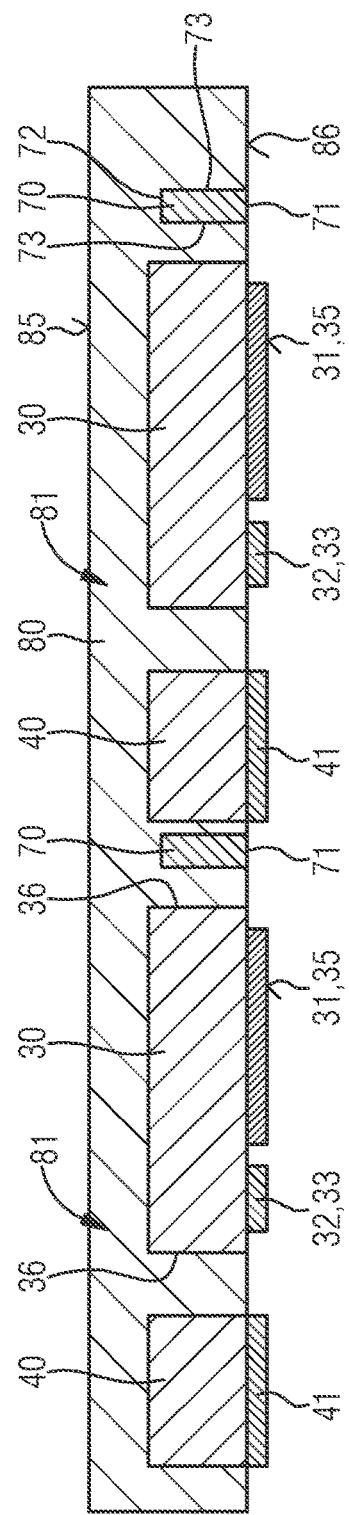
FIG. 4 shows a sectional view of the first molded body assemblage after detaching the carrier.

FIG. 4 shows the carrier 2 in a method state succeeding the illustration in FIG. 3. The first molded body assemblage 80 comprising the first molded bodies 81 has been detached from the carrier 2. If a film comprising a thermally releasable adhesive layer was used as adhesion layer 4, the carrier 2 may have been detached by heating of the adhesion layer 4, for example. If the film was arranged on the carrier in such a way that the thermally releasable adhesive layer is arranged on the component side 6 of the adhesion layer 4, then the film remains on the carrier 2 after detaching the molded body assemblage 80.

Since the first molded bodies 81 of the first molded body assemblage 80 have been molded around the first electronic components 30, the through-contact elements 40 and the sacrificial structure 70, or said electronic components, through-contact elements and sacrificial structure have been encapsulated by the first molded bodies 81, they are held by the first molded bodies 81 of the first molded body assemblage 80 even after the carrier 2 has been detached. After the carrier 2 has been detached, the surfaces 35 of the first electronic components 30, the first contact pads 41 of the through-contact elements 40 and the top side 71 of the first sacrificial structure 70 are exposed at the front side 86 of the first molded bodies 81.

FIG. 5 shows the molded body assemblage 80 comprising the first molded bodies 81 in a method state succeeding the illustration in FIG. 4. A part of the first molded bodies 81 of the first molded body assemblage 80 has been removed proceeding from the rear sides 85 of the molded bodies 81. The removing may have been carried out by grinding of the rear sides 85, for example.

Removing parts of the first molded bodies 81 has resulted in the rear sides 85 thereof having been set back to an extent such that they terminate flush with the base faces 39 of the first electronic semiconductor chips 30, the second contact pads 42 of the through-contact elements 40 and the underside 72 of the first sacrificial structure 70. As a result, in particular, the rear-side contact pads 34 of the first electronic semiconductor chips 30 and the second contact pads 42 of the through-contact elements 40 may be contacted from outside the first molded bodies 81. The first semiconductor chips 30, the through-contact elements 40 and the first sacrificial structure 70 are held only at their respective side faces 36, 43, 73 after the grinding.

FIG. 6 shows the first molded body assemblage 80 comprising the first molded bodies 81 in a method state succeeding the illustration in FIG. 5. The first sacrificial structure 70 has been removed. For removal, the first sacrificial structure 70 may be dissolved, for example, using a suitable solvent, such as acetone, for instance.

As a result of the first sacrificial structure 70 being removed, first cutouts 82 are formed in the first molded bodies 81. The first cutouts 82 form through openings in the first molded bodies 81.

FIG. 7 shows the first molded body assemblage 80 comprising the first molded bodies 81 in a method state temporally succeeding the illustration in FIG. 6. A plurality of contacts 95 have been formed on the rear sides 85 of the first molded bodies 81. The contacts 95 comprise an electrically conductive material, preferably a metal. The contacts 95 may be formed as a thin metal layer, for example. In each case one of the contacts 95 is arranged on the rear-side contact pads 34. Likewise, in each case one of the contacts 95 is arranged on the second contact pads 42 of the through-contact elements 40.

In this case, the contacts 95 may be arranged exclusively on the first electronic semiconductor chips 30 or respectively the through-contacts 40, or else additionally on the rear sides 85 of the first molded bodies 81. Via the contacts 95, the first electronic semiconductor chips 30 and the through-contacts 40 may be electrically conductively connected to an external conductor in a simple manner, for example, by means of soldering or wire bonding.

First connecting elements 90 are respectively arranged on the front side 86 of the first molded bodies 81. The first connecting elements 90 comprise, just like the contacts 95, an electrically conductive material, for example, a metal. They may have been applied, for example, as a thin metal layer on the front sides 86 of the first molded bodies 81, for example, by means of a vapor deposition process or a screen printing process.

The connecting elements 90 are arranged such that they electrically conductively connect respectively the front-side contact pads 33 of the first electronic semiconductor chips 30 to the first contact pads 41 of the through-contacts 40. As a result, the front-side contact pads 33 of the first electronic semiconductor chips 30 may be connected to external conductors via the contacts 95—arranged on the rear sides 85 of the first molded bodies 81—at the through-contacts 40. This allows the first electronic semiconductor chips 30 to be contacted exclusively from one side, for example, by means of a surface soldering process.

The first molded bodies 81 may be singulated by means of severing the first molded body assemblage 80. As a result, first electronic components 10 may be produced which comprise in each case one of the molded bodies 81, one of the first electronic semiconductor chips 30 and a through-contact 40. As will be described in connection with FIG. 8, the first molded body assemblage 80 may be severed during the singulation such that separating lines between the first electronic components 10 run in each case through the cutouts 82. As a result, wall faces 83 of the first cutouts 82 form side faces of the first electronic component 10. As will likewise be described in connection with FIG. 8, the side faces of the first electronic components 10 may thus also be structured by a structuring of the sacrificial structure 70.

The through-contact elements 40 may also comprise electronic components which perform additional functions in the driving of the electronic semiconductor chips. By way of example, the through-contact elements 40 may comprise protective diodes that protect the electronic semiconductor chip against damage resulting from electrostatic discharges.

Figure 8:
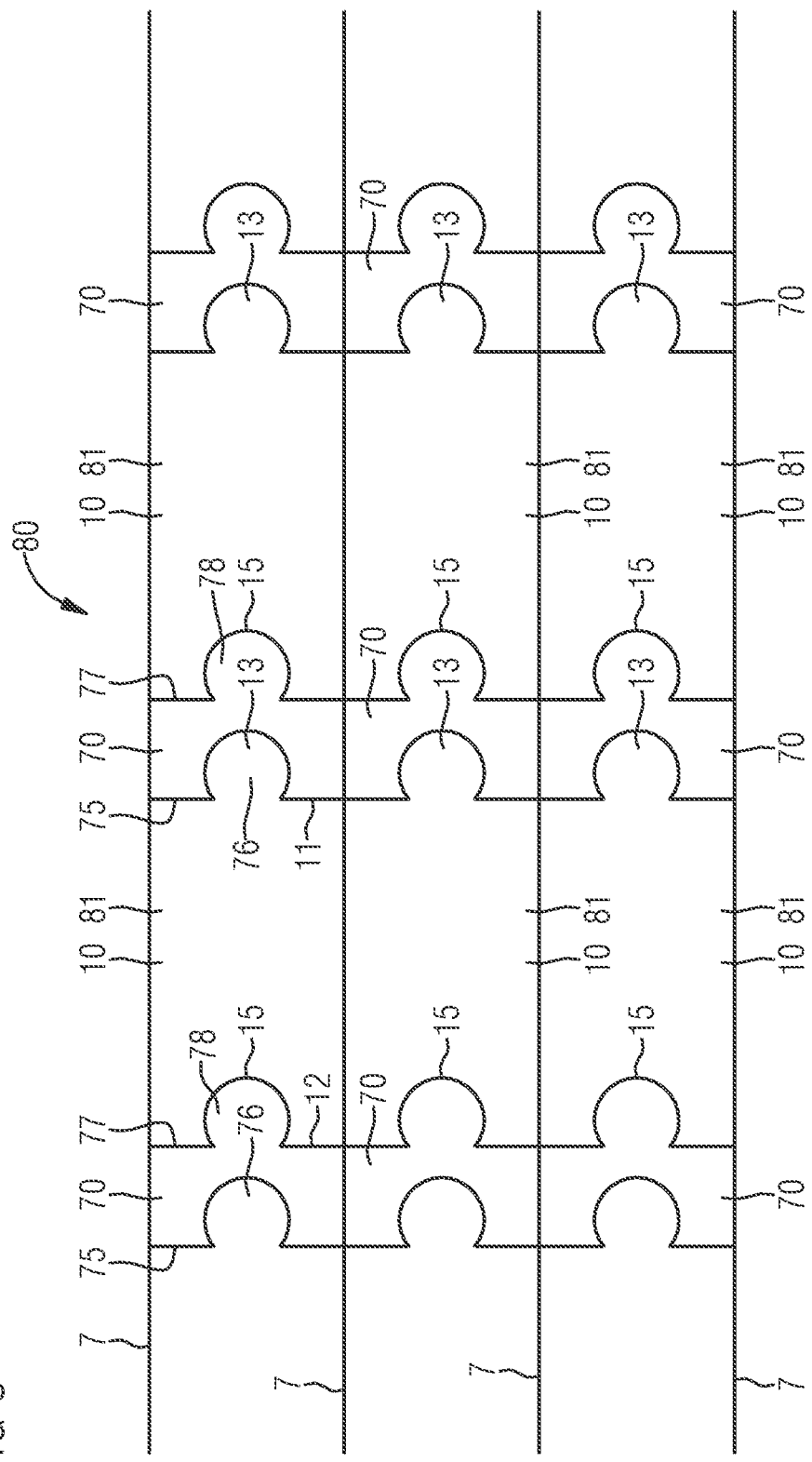
FIG. 8 shows a plan view of the first molded body assemblage with the first sacrificial structure.

FIG. 8 shows a plan view of the first molded body assemblage 80 comprising the first molded bodies 81 and the first sacrificial structure 70 in the method state illustrated in FIG. 5. The electronic semiconductor chips 30 and the through-contact elements 40 are not illustrated in FIG. 8, for the sake of better clarification. FIG. 8 illustrates an excerpt from the first molded body assemblage 80, wherein the excerpt comprises six first molded bodies 81. In order to produce a plurality of first electronic components 10, the first molded body assemblage 80 may comprise, for example, a matrix of hundreds of first molded bodies 81.

The individual elements of the first sacrificial structure 70 comprise a substantially rectangular shape, wherein a concave recess 76 is formed on a first long side 75 and a convex protuberance 78 is formed on a second long side 77 located opposite the first long side 75. The recess 76 and the protuberance 78 in this case comprise substantially the same shape and thus match one another, wherein the recess 76 constitutes the negative shape of the protuberance 78. The recess 76 and the protuberance 78 may be formed in a substantially circular fashion, as illustrated in FIG. 8.

The elements of the first sacrificial structure 70 are arranged adjacent to one another in three series. The series are in turn embedded into the first molded body assemblage 80 in a manner spaced apart from one another, such that the individual elements of the sacrificial structure 70 are respectively located at opposite sides of the first molded bodies 81 of the first electronic components 10. Here a first side face 11 of the first electronic components 10 is formed in each case on the first long side 75 of the elements of the first sacrificial structure 70 and a second side face 12 of the first electronic components 10 is in each case formed on the second long side 77 of the elements of the first sacrificial structure 70.

Since the molded bodies 81 mold around the sacrificial structures 70, a peg 13 is in each case shaped on the first side faces 11 of the first electronic components 10 in the region of the recesses 76. A groove 15 is in each case shaped on the second side faces 12 of the first electronic components 10 in the region of the protuberances 78. In this case, the recesses 76 form the negative shapes of the pegs 13 and the protuberances 78 form the negative shapes of the grooves 15. In the case of substantially circular recesses 76 and protuberances 78, the grooves 15 and pegs 13 are formed in a substantially circular fashion as well.

For singulating the first molded bodies 81, the first molded body assemblage 81 is severed along separating lines 7 which run in each case parallel to one another and transversely with respect to the elements of the first sacrificial structure 70 that are arranged in series. The severing may be carried out, for example, by sawing, laser cutting or breaking. In a direction perpendicular to the separating lines 7, the first molded bodies 81 are singulated by the first sacrificial structure 70 being removed. The first sacrificial structure 70 may be removed before or after the severing along the separating lines 7. If the severing is carried out after removing the first sacrificial structure 70, then the cutouts 82 formed in the first molded bodies 81 are also severed.

In an alternative configuration, the first electronic components 10 may completely surround, such that singulating may be carried out by removing the first sacrificial structure 70 and severing the first molded body assemblage 80 may be dispensed with. In this case, a plurality or all of the side faces may be shaped or structured by the first sacrificial structure 70. In this regard, it is possible, for example, to produce round or triangular electronic components from a molded body assemblage in a simple manner, without using complex separating methods, such as laser cutting, for instance.

Before the first sacrificial structure 70 is removed, the first molded body assemblage 80 may be applied once again on a suitable carrier means, in order to prevent the individual first electronic components 30 from falling apart in an uncontrolled manner after the first sacrificial structure 70 has been removed. By way of example, the first molded body assemblage may be adhesively bonded onto a film.

FIG. 9 illustrates a component arrangement 100 comprising a second electronic component 110 and a further second electronic component 120. In so far as no differences are described hereinafter, the second electronic components 110, 120 were produced in the same way as the first electronic components 10. Moreover, the second electronic component 110 and the further second electronic component 120 are formed identically, in so far as no differences are apparent from the following description.

The second electronic components 110, 120 comprise a second electronic semiconductor chip 130, which is formed like the first electronic semiconductor chips 30. In particular, the second electronic semiconductor chip 130 comprises a front-side contact pad 132 corresponding to the contact pad 32 of the first electronic semiconductor chips 30. The second electronic semiconductor chip 130 is embedded into a second molded body 181 produced like the first molded bodies 81.

The second electronic components 110, 120 comprise a respective peg 113 on a first side face 111, 121 and a respective groove 115 on a second side face 112, 122. The peg 113 and the groove 115 have been formed analogously to the pegs 13 and the grooves 15 of the first electronic components 10.

A contact structure 140 is in each case arranged on the peg 113 and on the groove 115. The contact structure 140 comprises an electrically conductive material, preferably a metal, and is arranged on a front side 186 of the second molded body 181. The contact structure 140 arranged on the peg 113 is formed in a planar fashion on that part of the front side 186 of the second molded body 181 which forms the top side of the peg 113. In this case, the contact structure 140 substantially completely covers the top side of the peg 113. The contact structure 140 arranged on the groove 115 is formed as a ring-shaped strip around the groove 115. If the peg 115 of the further second electronic component 120 are arranged in a manner engaging into the groove 113 of the second electronic component 110, then the contact structures 140 on the front sides 186 of the molded bodies 181 of the second components 110, 120 adjoin one another.

The second electronic component 110 comprises a connection element 119, which electrically conductively connects the front-side contact pad 132 of the second electronic semiconductor chip 130 to the contact structure 140 on the groove. In addition, the connection element 119 produces an electrically conductive connection to the through-contact element 40 of the second electronic component 110. A further connection element 129 is arranged on the further second electronic component 120, which further connection element electrically conductively connects the through-contact element 40 of the further second electronic component 120 to the contact pad 132 of the second electronic semiconductor chip 130.

The second electronic component 110 and the further second electronic component 120 of the component arrangement 100 are arranged in a manner adjoining one another in such a way that the peg 113 of the further second electronic component 120 engages into the groove 115 of the second electronic component 120 in an anchoring fashion. In this case, the anchoring is produced by a positively locking engagement between groove 115 and peg 113.

Alongside the mechanical connection by positively locking engagement, the second electronic component 110 and the further electronic component 120 are also electrically conductively connected to one another. For this purpose, an electrically conductive connection 150 is arranged on the second electronic components 110, 120, which electrically conductive connection electrically conductively connects the contact structure 140 on the groove 115 of the second electronic component 110 to the contact structure 140 on the peg 113 of the further second electronic component 120.

The electrically conductive connection 150 may comprise, for example, an electrically conductive adhesive or a soldering tin and may be fitted on the contact structures 140 in a punctiform fashion. By means of the electrically conductive connection 150, an additional mechanical fixing of the second electronic component 110 to the further second electronic component 120 may also be implemented in order thus to prevent a relative movement of the second electronic components 110, 120 in a direction oriented perpendicular to the front side 186.

The electrical connection 150 on the contact elements 140 allows, for example, an electrical series connection of the second electronic components 110, 120 which are mechanically connected to one another via the grooves 115 and the pegs 113. It is also possible for a plurality of second electronic components 110 to be connected to one another in each case via the peg 113 and the groove 115 and thus for a chain comprising a multiplicity of second electronic components 110 to be formed. Such a series connection may be realized in a particularly simple manner if additional connection elements are arranged on the second electronic components 110, 120, such that the connecting faces of the second electronic semiconductor chips 130 are in each case electrically conductively connected to a contact structure 140 on the groove 115 or the peg 113.

In addition to the peg 113 on the first side face iii and the groove 115 on the second side face 112, the second electronic component 110 may also comprise respectively a peg and a groove on the other side faces. This allows such electronic components to be connected to one another in a planar arrangement by means of the pegs of one electronic component in each case being arranged in a manner engaging into the groove of another electronic component.

The peg 113 and the groove 115 may also comprise a different shape than the illustrated, substantially circular, shape. By way of example, the peg 113 and the groove 115 may be configured in the form of a dovetail connection. All that is crucial is that the peg may be arranged in the groove and an anchoring is achieved by at least partial positively locking engagement. Such an anchoring may be achieved, for example, by a suitable undercut of peg and groove. In this case, too, groove and peg match one another.

The contact structures 140 on the peg 113 and the groove 115 may also cover lateral wall faces of the peg 113 and/or of the groove 115. As a result, two second electronic components 110, 120 arranged adjacently may be electrically connected to one another solely by virtue of the fact that the peg 113 and the groove 115 are arranged such that they engage in one another in a positively locking manner. The electrically conductive connection 150 may be dispensed with in such a case.

In an alternative embodiment of the invention, instead of the first sacrificial structure 70, a second sacrificial structure 270 is arranged on the top side 3 of the carrier 2, as is shown in FIG. 10. The second sacrificial structure 270, like the first sacrificial structure 70, is fixed on the top side 3 of the carrier 2 by means of the adhesion layer 4. Unless described differently hereinafter, the second sacrificial structure 270 is produced in the same way as the first sacrificial structure 70. In particular, the second sacrificial structure 270 may be produced from a photoresist layer by means of a photolithographic process. FIG. 10 illustrates three elements of the second sacrificial structure 270 which are arranged in a manner spaced apart from one another on the top side 3 of the carrier 2. The individual elements of the second sacrificial structure 270 in each case have side faces 273, a top side 271 and an underside 272. In this case, the second sacrificial structure 270 is arranged on the carrier 2 in such a way that the top sides 271 face the carrier 2.

Figure ii shows the carrier 2 in a method state temporally succeeding the illustration in FIG. 10. Third electronic semiconductor chips 230 have been arranged on the top side 3 of the carrier 2. In so far as no differences are apparent from the following description, the third electronic semiconductor chips 230 are configured like the first and second electronic semiconductor chips 30, 130.

The third electronic semiconductor chips 230 are configured as optoelectronic semiconductor chips, for example, and, on a surface 235, comprise an emission face 231 and also two front-side contact pads 232. The rear-side contact pads 34 arranged on the first electronic semiconductor chips 30 may be omitted in the case of the third electronic semiconductor chips 230. The third electronic semiconductor chips 230 comprise, perpendicular to their surface 235, a height which is at most of exactly the same magnitude as a height of the second sacrificial structure 270 along the side faces 273 thereof.

The third electronic semiconductor chips 230 are arranged in a manner spaced apart laterally from the elements of the second sacrificial structure 270. In this case, the third electronic semiconductor chips 230 are arranged in each case between two elements of the second sacrificial structure 270 in a direction lying within the sectional direction of the illustration in FIG. 11.

Figure 12:
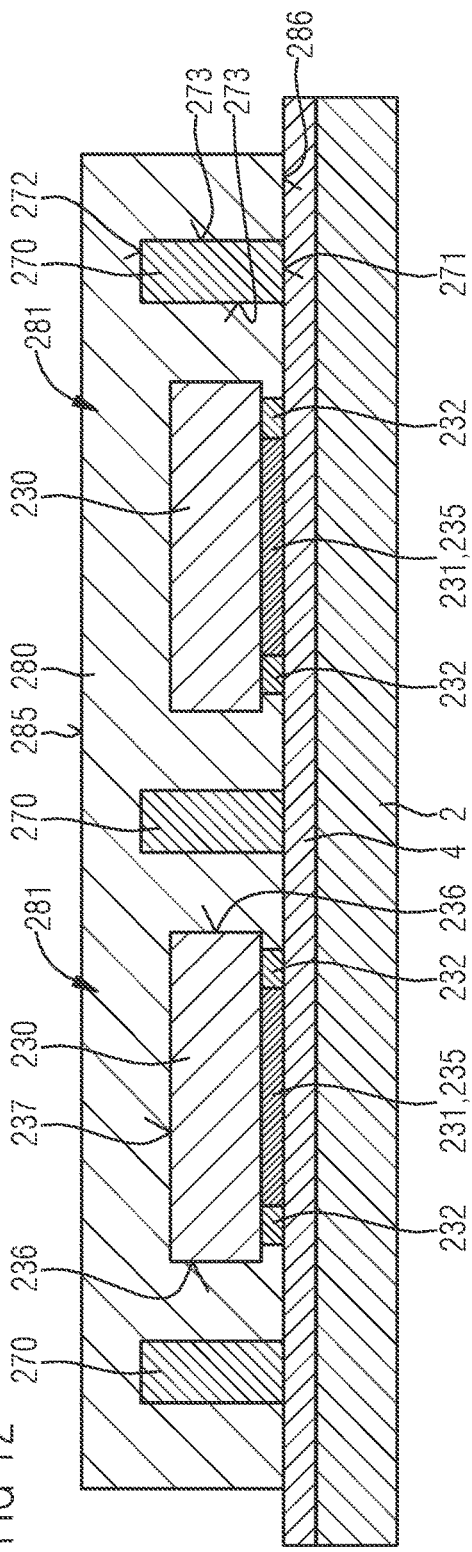
FIG. 12 shows a sectional view of the carrier with a second molded body assemblage comprising third molded bodies arranged on said carrier.

FIG. 12 shows the carrier 2 in a method state temporally succeeding the illustration in Figure ii. Third molded bodies 281 have been molded around the second sacrificial structure 270 and the third electronic components 230. In this case, the third molded bodies 281 form a second molded body assemblage 280. In this case, the third molded bodies 281 and the second molded body assemblage 280 are produced and formed substantially in exactly the same way as the first and second molded bodies 81, 181 and the first molded body assemblage 80, respectively. Each of the two third molded bodies 281 illustrated in FIG. 12 molds around one of the two third electronic semiconductor chips 230.

The third molded bodies 281 in each case comprise a front side 286 facing the carrier 2 and a rear side 285 located opposite the front side 286. The surface 235 of the third electronic semiconductor chips 230 and the top side 271 of the second sacrificial structure 270, since they face the carrier 2, are not covered by the third molded bodies 281 and terminate flush with the front sides 286 of the third molded bodies 281. The third molded bodies 281 are formed higher than the second sacrificial structure 270 and the third electronic semiconductor chips 230 in a direction perpendicular to the top side 3 of the carrier 2. They cover, in particular, the underside 272 and the side faces 273 of the second sacrificial structure 270, and side faces 236 of the third electronic semiconductor chips 230.

Figure 13:
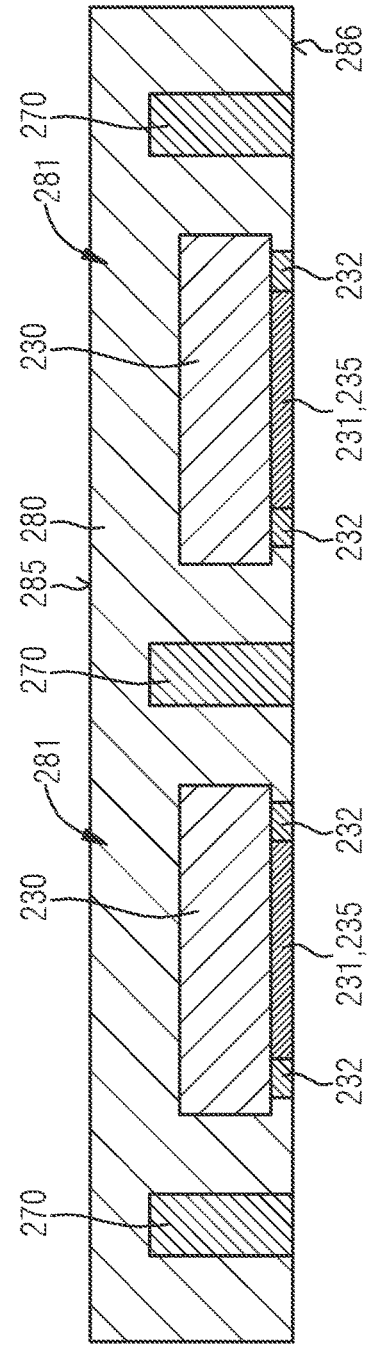
FIG. 13 shows a sectional view of the second molded body assemblage after removing the carrier.

FIG. 13 shows the second molded body assemblage 280 comprising the third molded bodies 281 in a method state temporally succeeding the illustration in FIG. 12. The carrier 2 was detached from the third molded bodies 281, as already described in connection with FIG. 4. As a result, the surfaces 236 of the third electronic semiconductor chips 230 that terminate flush with the top side 286 of the molded bodies 281, and also the top side 271 of the second sacrificial structure 270 were uncovered.

Figure 14:
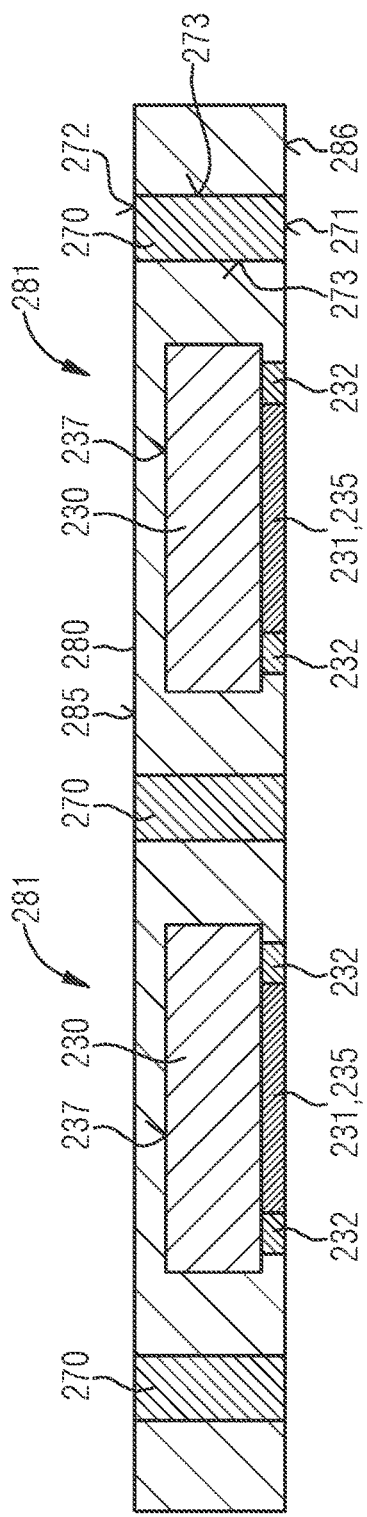
FIG. 14 shows a sectional view of the second molded body assemblage after partly removing a rear side of the third molded bodies.

FIG. 14 shows the second molded body assemblage 280 in a method state succeeding the illustration in FIG. 13. As described in connection with FIG. 5, in each case a part of the third molded bodies 281 was removed, proceeding from the rear sides 285 thereof, and the rear sides 285 of the third molded bodies 281 were thus set back. As a result, the underside 272 of the second sacrificial structure 270 were uncovered, such that the sacrificial structure 270 terminates flush with the third molded bodies 281 both on the front sides 286 and on the rear sides 285 of the third molded bodies 281. The side faces 273 of the elements of the third sacrificial structure 270 are still covered by the third molded bodies 280.

Since the third electronic semiconductor chips 230 comprise a smaller height than the second sacrificial structure 270 in the direction perpendicular to the rear sides 285 and the front sides 286 of the third molded bodies 281, base faces 237 of the third electronic semiconductor chips 230 located opposite the surfaces 235 are covered by the third molded bodies 281 even after the partial removal of the third molded bodies 281.

Figure 15:
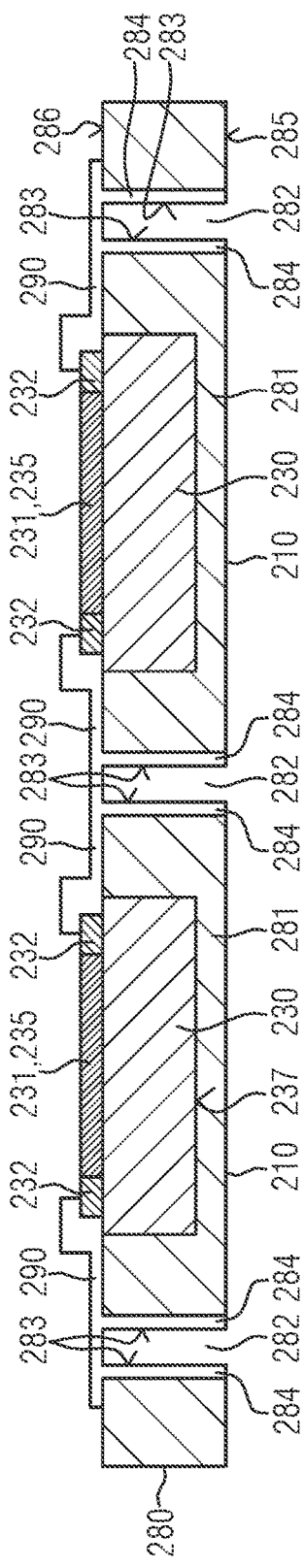
FIG. 15 shows a sectional view of the second molded body assemblage after removing the second sacrificial structure.

FIG. 15 shows an illustration of the third molded bodies 281 in a method state temporally succeeding the illustration in FIG. 14. The second sacrificial structure 270 was removed, as described in connection with FIG. 6. As a result, cutouts 282 were formed in the third molded bodies 281. Since the elements of the second sacrificial structure 270 previously terminated flush with the front sides 286 and the rear sides 285 of the third molded bodies 281, the cutouts 282 form through openings in the second molded body assemblage 280 comprising the third molded bodies 281.

Wall faces 283 of the cutouts 282 in the second molded body assemblage 280 have been covered with electrically conductive layers 284. The electrically conductive layers 284 may have been applied on the wall faces 283 by vapor deposition or by a chemical deposition process and may comprise, for example, a metal, for instance gold, silver or copper. The electrically conductive layers 284 extend between the front sides 286 and the rear sides 285 of the third molded bodies 281 and produce an electrically conductive connection between the front sides 286 and the rear sides 285.

A plurality of connection elements 290 have been arranged on the front sides 286 of the third molded bodies 281, which connection elements in each case electrically conductively connect the electrically conductive layers 284 on the wall faces 283 of the cutouts 282 to the contact pads 232 of the third electronic semiconductor chips 230.

The elements of the second sacrificial structure 270 which are used for forming the cutouts 282 may also comprise a smaller height than the third electronic components 210. As a result, the elements of the second sacrificial structure 270 are not uncovered after the partial removal of the rear sides 285 of the third molded bodies 281. As a result of the removal of the second sacrificial structure 270, cutouts 282 are then produced which instead of through openings form blind holes in the third molded bodies 281.

By severing the second molded body assemblage 280 between the individual third molded bodies 281, third electronic components 210 may be singulated from the molded body assemblage 280. The third electronic components 210 here comprise in each case one of the third molded bodies 281 with in each case a third electronic semiconductor chip 230 embedded into the respective third molded body 281. During singulation, the third molded body assemblage 280 is severed along separating planes which run through the cutouts 282 produced by the second sacrificial structure 270, such that the wall faces 283 of the cutouts 282 form parts of the outer faces of the third electronic components 210.

Figure 16:
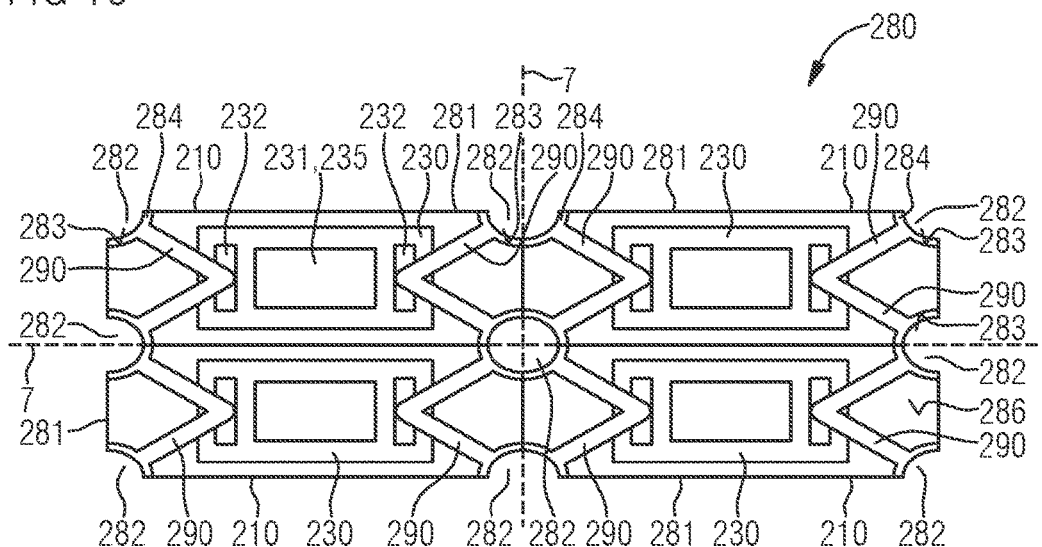
FIG. 16 shows a plan view of the second molded body assemblage comprising four third electronic components.

FIG. 16 shows a plan view of the front sides 286 of the third molded bodies 281 of the second molded body assemblage 280 in the method state illustrated in FIG. 15 before singulation. Four third electronic components 210 are illustrated. The third electronic components 210 are arranged in two series in the second molded body assemblage 280. In each case one of the cutouts 282 is arranged at the corner edges of the third electronic components 210, said corner edges being aligned perpendicularly with respect to the front sides 286 of the third electronic components 210. In this case, one of the cutouts 282 adjoins one to four third electronic components 210 depending on the position in the second molded body assemblage 280.

The third electronic components 210 may be singulated along separating lines 7 which run in two mutually perpendicular directions along the outer edges of the molded bodies 281 of the third electronic components 210. The separating lines 7 here respectively run through the cutouts 282, wherein mutually perpendicular separating lines 7 respectively intersect in the cutouts 282. The cutouts 282 are therefore severed in each case during singulation. The connection elements 290 respectively connect a contact pad 232 of the third electronic semiconductor chips 210 to the electrically conductive layers 284 on the wall faces 283 of the two closest cutouts 282.

The surfaces 235 of the third electronic semiconductor chips 230 have not been covered by the third molded bodies 281, such that the emission faces 231 of the third electronic semiconductor chips 210 are exposed and the radiation emitted by the third electronic semiconductor chips 230 may emerge from the third electronic components 210.

Figure 17:
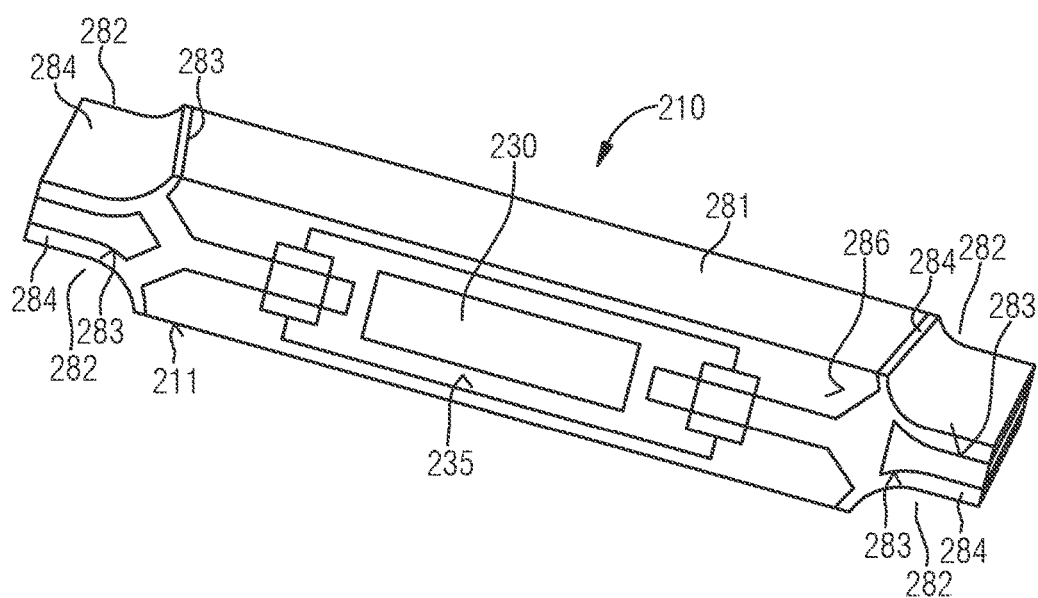
FIG. 17 shows a perspective view of a third electronic component.

FIG. 17 shows one of the third electronic components 210 after singulation. The cutouts 282 form recesses that run along the corner edges of the third molded body 281. The third electronic semiconductor chip 230 may be electrically contacted via the conductive layer 284 applied on the wall faces 283 of the cutouts 282. For this purpose, for example, an underside 211 of the third electronic component 210, said underside being formed substantially perpendicularly to the front side 286 and the rear side 287 of the third molded body 281, may be arranged on a planar face, for example, a printed circuit board. A conductive connection may be produced, for instance by soldering, between the conductive layer 284 in the cutouts 282 adjoining the underside 211 and conductor tracks on the face. As a result, the third electronic component 210 may be arranged on the planar face, for example, in such a way that electromagnetic radiation is emitted from the emission face 231 of the electronic semiconductor chip 230 laterally in a direction parallel to the planar face.

It is also possible to mold a molded body around a plurality of electronic semiconductor chips. In this way, for example, electronic components may be produced which comprise not just one electronic semiconductor chip, as illustrated in FIG. 9 or FIG. 17, but rather a plurality of electronic semiconductor chips. In the case of the third electronic components 210, for example, a plurality of third electronic semiconductor chips 230 may be arranged in a series parallel to the underside 211 of the third electronic components 210. If the underside 211 is arranged on a planar face, then the electronic semiconductor chips 230 may be positioned alongside one another on the face. In this case, the electronic semiconductor chips may be connected in series one after another and the series connection may be contacted via two conductively coated cutouts arranged respectively on a side edge of the electronic component.

Instead of arranging the first sacrificial structure 70 or the second sacrificial structure 270 on the edge of the electronic components 10, 210, or on the edge of the molded bodies 81, 281, the sacrificial structures may also be arranged such that they are completely enclosed by a molded body on all side faces 73, 273. By way of example, one of the third molded bodies 281 may be molded completely around one of the cylindrical elements of the second sacrificial structure 270. In this case, by removing the cylindrical element of the second sacrificial structure 270, it is possible to create a through opening in the third molded body 281 or the third electronic component 210. If wall faces of such a cutout forming a through opening are provided with an electrically conductive layer, the through opening may be used for the through-contacting of the electronic component 210 instead of the through-contact elements 40 described in association with the first electronic components 10.

Figure 18:
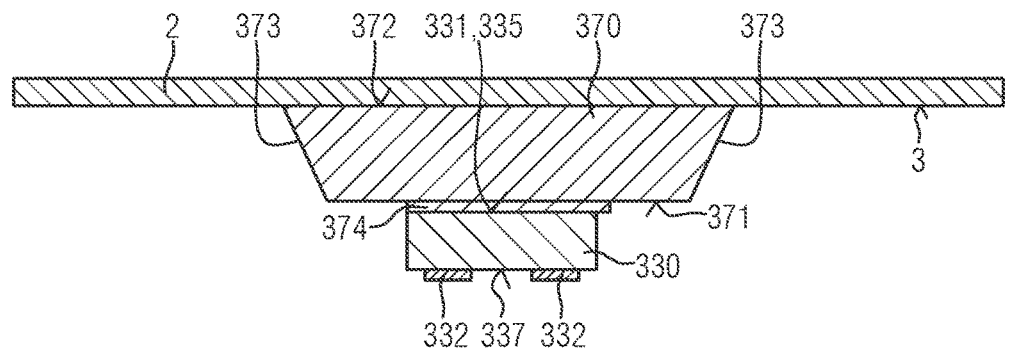
FIG. 18 shows a sectional view of the carrier with a third sacrificial structure arranged on said carrier and with a fourth electronic semiconductor chip arranged on the third sacrificial structure.

FIG. 18 shows the carrier 2 with a third sacrificial structure 370 arranged on its top side 3 in a first method state of a method for forming a fourth electronic component. Unless described otherwise hereinafter, the third sacrificial structure 370 was formed in the same way as the first sacrificial structure 70 and the second sacrificial structure 270. In particular, the third sacrificial structure 370 may have been produced from a photoresist layer by means of a photolithographic process. Although not explicitly illustrated, the third sacrificial structure 370 may be fixed on the carrier 2 by the adhesion means 4 in the same way as the first and second sacrificial structure 70, 270.

The third sacrificial structure 370 is formed as a four-sided truncated pyramid. It is thus identical to a pyramid having a rectangular or square base face or underside 272, the vertex of which pyramid was cut off in order to form a top side 271 parallel to the underside 272. The third sacrificial structure 370 is arranged on the carrier 2 by its underside 272.

A fourth electronic semiconductor chip 330 is arranged on the top side 371 of the third sacrificial structure 370. Unless described otherwise, the fourth electronic semiconductor chip 370 is configured like the first electronic semiconductor chips 30, the second electronic semiconductor chips 110, 120 or the third electronic semiconductor chips 230. The fourth electronic semiconductor chip 330 is formed, for example, as an optoelectronic semiconductor chip and may be an LED chip, for example. A surface 335 of the fourth electronic semiconductor chip 330 forms an emission face 331, by which electromagnetic radiation may be emitted. A base face 337 of the fourth electronic semiconductor chip 330 located opposite the surface 335 comprises two contact pads 332.

The fourth electronic semiconductor chip 330 is arranged on the third sacrificial structure 370 such that the surface 335 of the fourth electronic semiconductor chip 330 faces the top side 371 of the third sacrificial structure 370. The fourth electronic semiconductor chip 330 is fixed on the third sacrificial structure 370 by means of an adhesive layer 374. The adhesive layer 374 may be, for example, a still moist layer of a photoresist that was also used to form the third sacrificial structure 370. Preferably, the adhesive layer 374 may dissolve using the same solvents as the third sacrificial structure 370.

The top side 371 of the third sacrificial structure 370 may, as shown in FIG. 18, comprise a larger extent than the surface 335 of the fourth electronic semiconductor chip 330 in one or all directions. Alternatively, the top side 371 of the third sacrificial structure 370 may also comprise a smaller extent than the surface 335 of the fourth electronic semiconductor chip 330 in one or all spatial directions. In such a case, the top side 371 of the third sacrificial structure 370 may cover, for example, only an emission face 331 formed on the surface 335 and comprising a smaller extent than the surface 335.

Instead of the third sacrificial structure 370, as described, initially being formed on the top side 3 of the carrier 2, the third sacrificial structure 370 may also be formed on the surface 335 of the fourth electronic semiconductor chip 330. By way of example, the third sacrificial structure 370 may be formed by means of a photolithographic method on the surface 335 of the fourth electronic semiconductor chip 330. This may already be carried out while the fourth electronic semiconductor chip 330 is still connected to further fourth electronic semiconductor chips 330 in a wafer assemblage. The photolithographic method may then be performed in one method step simultaneously on all the fourth electronic semiconductor chips 330 before the fourth electronic semiconductor chips 330 are singulated.

The third sacrificial structure 370 may be formed on the surface 335 of the fourth electronic semiconductor chip 330 before the semiconductor chip 330 is arranged on the top side 3 of the carrier 2, for example, if the third sacrificial structure 370 is intended to cover only a part of the surface 335, for example, the part comprising the emission face 331. In this case, the top side 371 of the third sacrificial structure 370 comprises a smaller extent than the surface 335 of the fourth electronic semiconductor chip 330 in one or all spatial directions.

After the third sacrificial structure 370 has been formed on the surface 335 of the fourth electronic semiconductor chip 330, the third sacrificial structure 370 and the fourth electronic semiconductor chip 330 may be arranged jointly on the top side 3 of the carrier 2 such that the third sacrificial structure 370 is located between the carrier 2 and the fourth electronic semiconductor chip 330.

Figure 19:
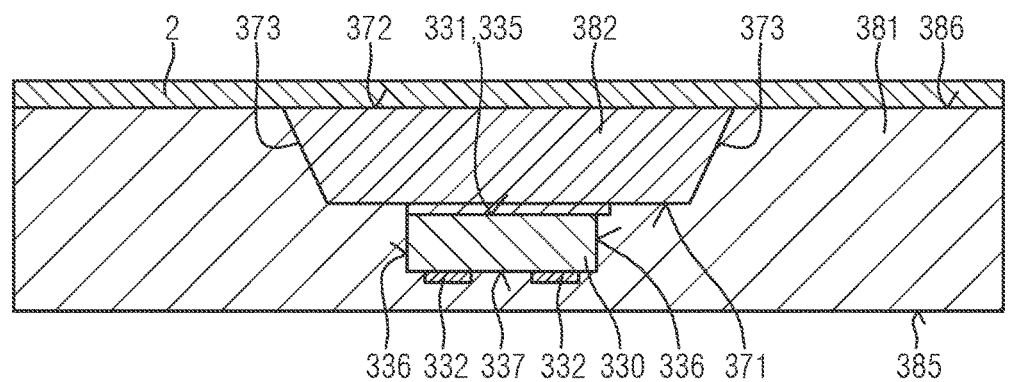
FIG. 19 shows a sectional view of the carrier with a fourth molded body formed on said carrier.

FIG. 19 shows the carrier 2 in a method state succeeding the illustration in FIG. 18. A fourth molded body 381 has been molded around the third sacrificial structure 370 and the fourth electronic semiconductor chip 330. Unless described otherwise, the fourth molded body 381 is configured just like the first molded bodies 81, the second molded bodies 181 or the third molded bodies 281.

The fourth molded body 381 comprises a front side 386 and a rear side 385 opposite the front side 386. The front side 386 faces the carrier 2 and terminates flush with the underside 372 of the third sacrificial structure 370 arranged on the carrier 2. As a result, the underside 372 of the third sacrificial structure 370 forms a portion that is cut out in the front side 386 of the fourth molded body 381.

The fourth molded body 381 completely covers side faces 373 of the third sacrificial structure 370. Likewise, the fourth molded body 381 completely covers the base face 337 and side faces 336 of the fourth electronic semiconductor chip 330. Since the surface 335 comprising the emission face 331 of the fourth electronic semiconductor chip 330 is arranged on the top side 371 of the third sacrificial structure 370, the surface 335 of the fourth electronic semiconductor chip 330 is not covered by the fourth molded body 381.

Figure 20:
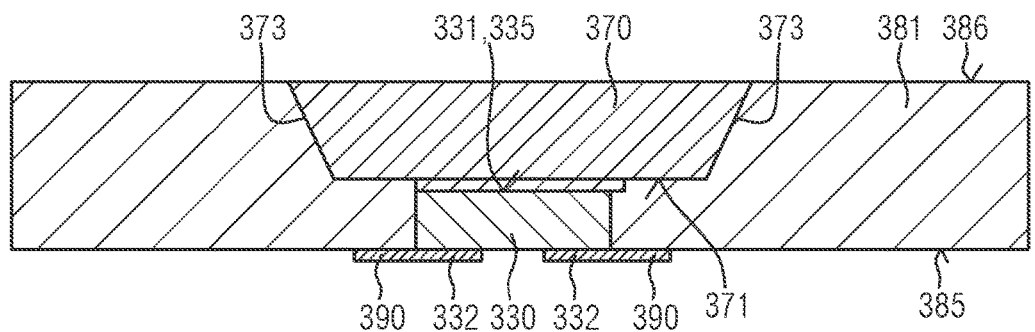
FIG. 20 shows a sectional view of the fourth molded body after removing the carrier and partly removing a rear side of the fourth molded body.

FIG. 20 shows the fourth molded body 381 in a method state temporally succeeding the illustration in FIG. 19. As described in connection with the first molded bodies 81 or the third molded bodies 281, the fourth molded body 381 was detached from the carrier 2 and a part of the fourth molded body 381 was removed proceeding from the rear side 385 thereof. During the removal of a part of the fourth molded body 381, the rear side 385 thereof was offset inwardly to an extent such that the base face 337 of the fourth electronic semiconductor chip 330 terminates flush with the rear side 385 of the fourth molded body 381. As a result, the base face 337 of the fourth electronic semiconductor chip 330 is exposed and the contact pads 332 arranged thereon may be contacted from outside the fourth molded body 381. For the sake of better contactability, second connecting elements 390 are arranged on the contact pads 332 and the rear side 385 of the fourth molded body 381. The second connecting elements 390 are configured like the first connecting elements 90.

Figure 21:
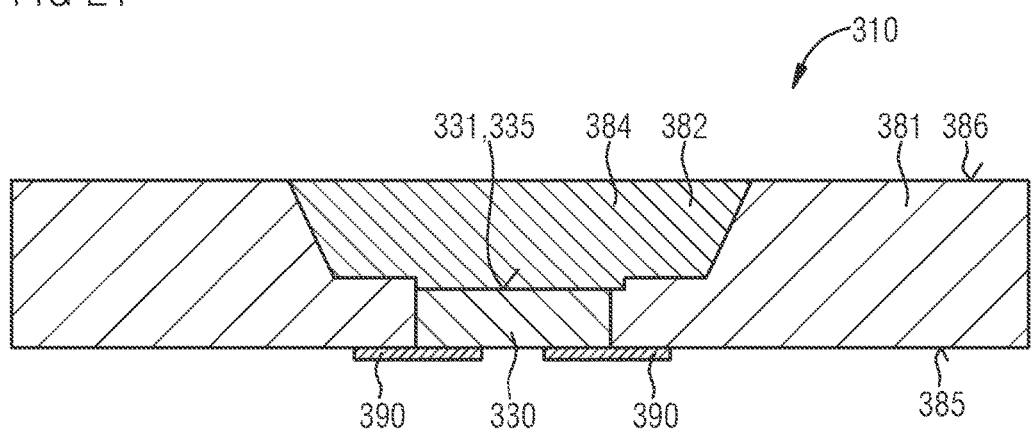
FIG. 21 shows a sectional view of a fourth electronic component.

FIG. 21 shows a sectional view of a fourth electronic component 310 comprising the fourth molded body 381 illustrated in FIG. 20. The third sacrificial structure 370 was removed from the fourth molded body 381, as described in connection with the first sacrificial structure 70 and the second sacrificial structure 270. As a result, a cutout 382 was produced in the fourth molded body 381, said cutout forming a cavity in the fourth molded body 381.

The cutout 382 forms a portion that is cut out in the front side 386 of the fourth molded body 381. The surface 335 of the fourth electronic semiconductor chip 330 comprising the emission face 331 is exposed at a base of the cutout 382 opposite the portion that is cut out. As a result, electromagnetic radiation emitted at the emission face 331 may emerge from the fourth electronic component 310 through the cutout 382.

Since the third sacrificial structure 370 had been formed as a truncated pyramid, the cutout 382 widens proceeding from its base in the direction of the portion that is cut out in the front side 386 of the fourth molded body 381. For the purpose of focusing the emitted light and in order to increase the luminous efficiency, wall faces 383 of the cutout 382 may be formed in a reflective fashion.

A potting compound 384 is arranged in the cutout 382. The potting compound 384 is preferably configured to enable electromagnetic radiation to emerge from the electronic component 310. The potting compound 384 may comprise, for example, a transparent potting material, for example, an epoxy resin, a silicone or a thermoplastic. The potting compound 384 may comprise incorporated wavelength-converting particles in order to alter the frequency and wavelength of the electromagnetic radiation emitted by the fourth electronic component 310. Moreover, diffuser particles may be incorporated into the potting compound 384, said diffuser particles scattering the light emitted by the electronic semiconductor chip 330 and thus enabling a homogeneous emission.

The fourth electronic components 310 may be produced in a molded body assemblage, like the first, second or third electronic components 10, 110, 210. In this case, a plurality of third sacrificial structures 270 with fourth electronic semiconductor chips 310 arranged thereon are arranged in a grid-shaped fashion in a manner spaced apart from one another on the carrier 2. Afterward, the molded body assemblage is molded around the third sacrificial structures 370 and fourth electronic semiconductor chips 310, said molded body assemblage in each case forming a fourth molded body 381 around in each case one of the third sacrificial structures 370 and one of the fourth electronic semiconductor chips 330. As described in connection with the first, second and third electronic components 10, 110, 210, the fourth electronic components 310 are subsequently singulated by the severing of the molded body assemblage.

Figure 22:
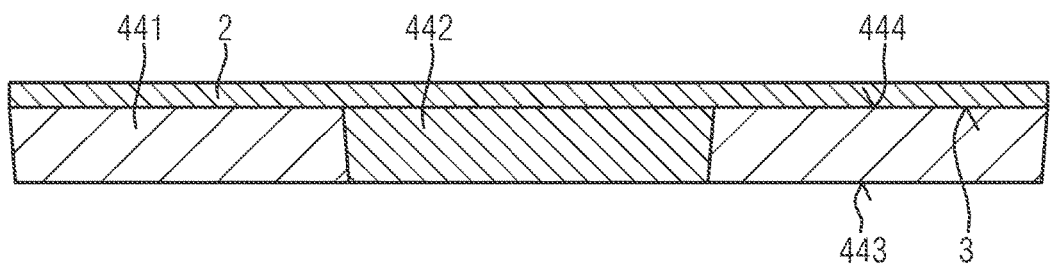
FIG. 22 shows a sectional view of the carrier with an exposed first photoresist layer arranged on said carrier.

FIG. 22 shows the carrier 2 with a first photoresist layer 441 for forming a fifth electronic component, said first photoresist layer being arranged on the top side 3 of said carrier. The first photoresist layer 441 is arranged homogeneously on the top side 3 of the carrier 2 and may have been applied by spin coating, for example, on the top side 3. The first photoresist layer may comprise a thickness of 10 μm to 1 mm; it preferably comprises a thickness of a few hundred micrometers.

The first photoresist layer 441 comprises a top side 443 and an underside 444 opposite the top side 443. The underside 444 is arranged in a manner facing the carrier 2. The first photoresist layer 441 additionally comprises a first exposed region 442, which may have been created, for example, by means of a photolithographic exposure method using a photomask. The first exposed region 442 extends from the top side 443 as far as the underside 444 of the first photoresist layer 441 and may comprise, for example, a substantially rectangular contour on the top side 443.

Figure 23:
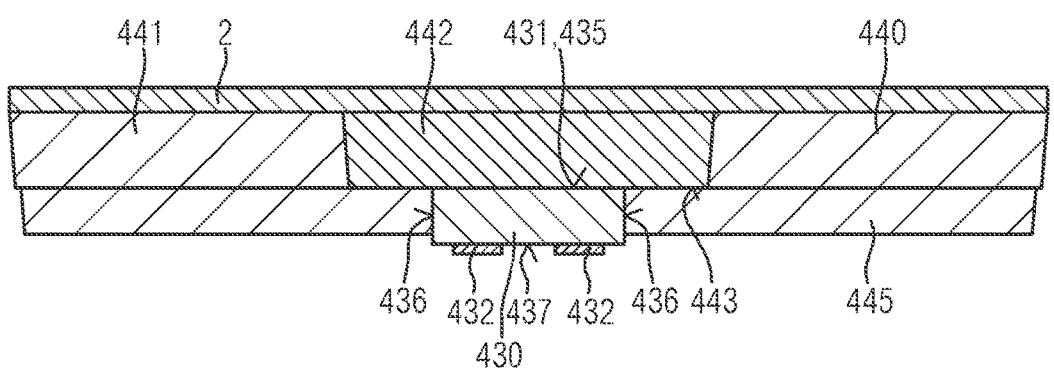
FIG. 23 shows a sectional view of the carrier with a second photoresist layer arranged on the first photoresist layer and with a fifth electronic semiconductor chip.

FIG. 23 illustrates the carrier 2 in a method state temporally succeeding the illustration in FIG. 22. A second photoresist layer 445 has been arranged on the top side 443 of the first photoresist layer 441. The second photoresist layer 445 may have been applied by spin coating, like the first photoresist layer 441. The first photoresist layer 441 and the second photoresist layer 445 form a two-layered photoresist system 440.

In addition to the second photoresist layer 445, a fifth electronic semiconductor chip 430 is arranged on the top side 443 of the first photoresist layer 441. Unless described otherwise, the fifth electronic semiconductor chip 430 is formed like the first, second, third or fourth electronic semiconductor chip 30, 130, 230, 330. The fifth electronic semiconductor chip 430 may be formed, for example, in a rectangular fashion and comprises a surface 435 and a base face 437 opposite the surface 435. The surface 435 is arranged in a manner facing the top side 443 of the first photoresist layer 441. The fifth electronic semiconductor chip 230 is arranged on the first exposed region 442 of the first photoresist layer 441. In this case, the extent of the first exposed region 442 along the top side 443 of the first photoresist layer is larger than the corresponding extent of the fifth electronic semiconductor chip 430 preferably in one or all directions.

The fifth electronic semiconductor chip 430 is covered by the second photoresist layer 445 on side faces 436. A thickness of the second photoresist layer 446 oriented perpendicularly to the top side 443 of the first photoresist layer 441 is smaller than a height of the fifth electronic semiconductor chip 430 oriented in the same direction. As a result, the second photoresist layer 445 only partly covers the side faces 436 of the fifth electronic semiconductor chip 430. The base face 437 of the fifth electronic semiconductor chip 430, and also in each case a part of the side faces 436 of the fifth electronic semiconductor chip 430, are not covered by the second photoresist layer 445.

During the arrangement of the fifth electronic semiconductor chip 430, the latter may have been pressed into the still moist second photoresist layer 445, for example. Alternatively, the fifth electronic semiconductor chip 430 may also have been arranged on the first photoresist layer before the second photoresist layer 445 and may subsequently have been encapsulated by the second photoresist layer 445.

The fifth electronic semiconductor chip 430 is configured, for example, as an optoelectronic semiconductor chip and may be an LED chip, for example. By way of example, the fifth electronic semiconductor chip 430 may be configured as a volume emitter that emits electromagnetic radiation both at its surface 435 and at the side faces 436. An emission face 431 in the case of the fifth electronic semiconductor chip 430 thus comprises both the surface 435 thereof and, at least partly, the side faces 436 thereof. On its base face 437, the fifth electronic semiconductor chip 430 comprises two contact pads 432. The latter may be configured like the contact pads 332 of the fourth electronic semiconductor chip 330.

After the fifth electronic semiconductor chip 430 and the second photoresist layer 445 were arranged on the top side 443 of the first photoresist layer 441 of the photoresist system 440, the second photoresist layer 445 is exposed. As in the case of the first photoresist layer 441, the exposure may be carried out by means of a photomask arranged on the second photoresist layer 445. During the exposure, a second exposed region 446 of the second photoresist layer 445 is formed around the fifth electronic semiconductor chip 430. The second exposed region 446 may comprise, for example, a rectangular shape around the fifth electronic semiconductor chip 430. The second exposed region 446 extends over the entire thickness of the second photoresist layer 445 and, along the top side 443 of the first photoresist layer 441, comprises substantially the same extent as the first exposed region 441, but may, for example, also comprise a smaller extent.

Figure 24:
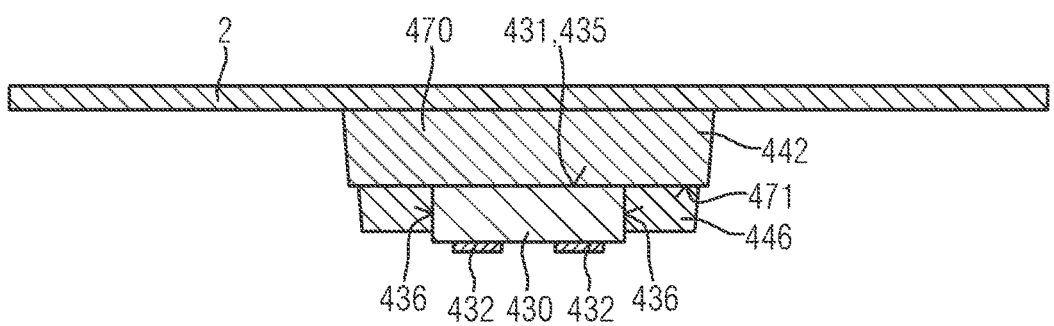
FIG. 24 shows a sectional view of the carrier with a fourth sacrificial structure formed from the first and second photoresist layers.

After the exposure of the second photoresist layer 445 of the photoresist system 440, the first photoresist layer 441 and the second photoresist layer 445 are developed. All non-exposed parts of the first photoresist layer 441 and of the second photoresist layer 445 are removed in the process. FIG. 24 shows an illustration of the carrier 2 after the development of the photoresist system 440. The first exposed region 442 of the first photoresist layer 441 has remained on the top side 3 of the carrier 2. The second exposed region 446 of the second photoresist layer 445 has remained on the top side 443 of the first exposed region 442. In this case, the second exposed part 446 at least partly covers the side faces 436 of the fifth electronic semiconductor chip 430.

The first exposed part 442 illustrated in FIG. 24 and the second exposed part 446 form a fourth sacrificial structure 470 on the top side 3 of the carrier 2, into which the fifth electronic semiconductor chip 430 is partly embedded. In this case, a top side 471 of the fourth sacrificial structure 470, on which the fifth electronic semiconductor chip 430 is arranged, is formed by the top side 443 of the first photoresist layer 441 in the first exposed region 442 thereof. A part of the fourth sacrificial structure 470, namely the part formed from the first exposed region 442 of the first photoresist layer 414, is located between the fifth electronic semiconductor chip 430 and the carrier 2.

Instead of a photolithographic process in which the non-exposed regions of the photoresist system 440 are removed (negative process), it is also possible to use a process in which the exposed regions are removed (positive process). In this case, for forming the first photoresist layer 441 and the second photoresist layer 445, a positive resist is used in which the exposed locations become soluble in the developer. In this case, the photomasks used should be adapted to the effect that the first and second exposed regions 442, 446 illustrated in FIG. 23 are shaded and the rest of the photoresist system 440 is exposed. Analogously, both a positive process and a negative process may also be used for forming the first, second or third sacrificial structure 70, 270, 370.

Analogously thereto, as was described in connection with the first, second and third sacrificial structures 70, 270, 370, the fourth sacrificial structure 470 with the embedded fifth electronic semiconductor chip 430 may firstly be produced on a separate carrier and then be transferred to the top side 3 of the carrier 2.

Figure 25:
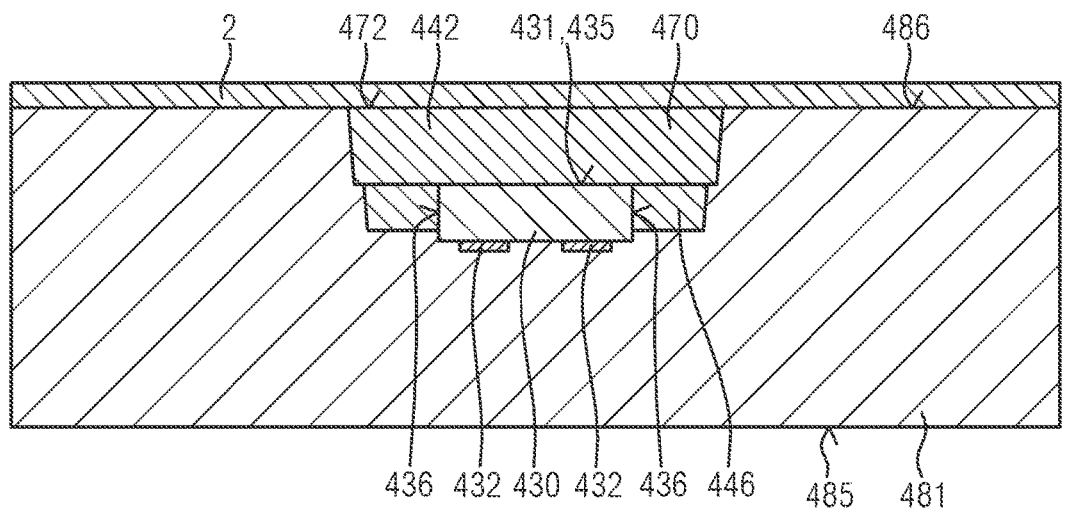
FIG. 25 shows a sectional view of the carrier with a fifth molded body formed on said carrier.

FIG. 25 shows the carrier 2 in a method state succeeding the illustration in FIG. 24. A fifth molded body 481 has been formed on the top side 3 of the carrier 2, said fifth molded body molding around the fourth sacrificial structure 470 and the fifth electronic semiconductor chip 430. Unless described otherwise, the fifth molded body 481 was formed like the first molded body 81, the second molded body 181, the third molded body 281 or the fourth molded body 381. The fifth molded body 481 comprises a front side 486 and a rear side 485 opposite the front side 486. The front side 486 of the fifth molded body 481 is arranged in a manner facing the carrier 2. As in the case of the third sacrificial structure 370, the front side 486 terminates flush with an underside 472 of the fourth sacrificial structure 470 arranged on the top side 3 of the carrier 2.

In a direction perpendicular to the top side 3 of the carrier 2, the fifth molded body 481 is formed higher than the fourth sacrificial structure 470 with the fifth electronic semiconductor chip 430 arranged thereon. As a result, the part—not covered by the fourth sacrificial structure 470—of the side faces 436 of the electronic semiconductor chip 430 and the base face 437 thereof comprising the contact pads 432 is covered by the fourth sacrificial structure 470.

Figure 26:
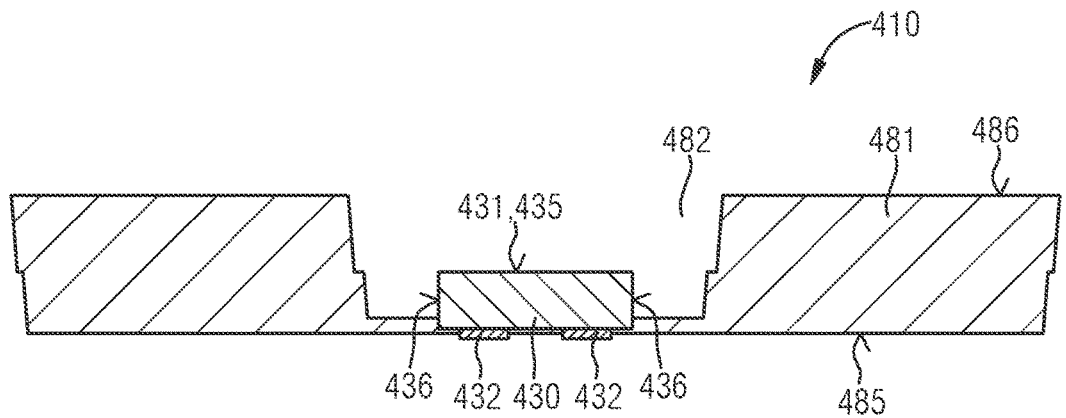
FIG. 26 shows a sectional view of a fifth optoelectronic component.

FIG. 26 illustrates a sectional view of an electronic component 410 comprising the fifth molded body 481 illustrated in FIG. 25. The fifth molded body 481 was detached from the carrier 2 like the first, second, third or fourth molded body 81, 181, 281, 381. Moreover, just like in the case of the first, second, third or fourth molded body 81, 181, 281, 381, a part of the fifth molded body 481 was removed proceeding from the rear side 485 thereof until the rear side 485 of the fifth molded body 481 terminates flush with the base face 437 of the fifth electronic semiconductor chip 430.

Like the first, second or third sacrificial structure 70, 270, 370, the fourth sacrificial structure 470 was removed from the fifth molded body 481. As a result, a cutout 482 was produced in the fifth molded body 481. The cutout 482, analogously to the cutout 382 in the fourth molded body 381, adjoins the front side 486 of the fifth molded body 481 and forms a window in the front side 486. The surface 435 of the fifth electronic semiconductor chip 430 is uncovered on a side of the cutout 486 opposite the window.

Since the fourth sacrificial structure 470 had been formed in a manner partly adjoining the side faces 436 of the fifth electronic semiconductor chip 430, the cutout 482 also adjoins the side faces 436 of the fifth electronic semiconductor chip 430. The side faces 436 are at least partly uncovered within the cutout 482 of the fifth molded body 481. As a result, radiation emitted by the electronic semiconductor chip 430 via the emission face 431, which is formed by the surface 435 and the side faces 436 in the case of a volume emitter, may emerge from the fifth electronic component 410 through the cutout 482.

The cutout 482 may, like the cutout 382 in the fourth molded body 381, be filled with a potting compound in order to achieve a wavelength conversion and/or diffuse scattering of the emitted radiation. Sidewalls of the cutout 482 may likewise be formed in a reflective fashion. The cutout 382 may widen toward the front side 486 of the fifth molded body 481.

As in association with the fourth electronic component 310, contact elements may also be fitted on the base side 485 of the fifth molded body 481 and the contact pads 432 of the electronic semiconductor chip.

Like the first, second, third or fourth electronic components 10, 110, 210, 310, the fifth electronic components 410 may likewise be produced by means of a molded body assemblage. The molded body assemblage then comprises a plurality of fifth molded bodies 481, which for their part respectively mold around a fifth electronic semiconductor chip 430 and a fourth sacrificial structure 470.

Although the invention has been more specifically illustrated and described in detail by means of the preferred exemplary embodiments, nevertheless the invention is not restricted by the examples disclosed and other variations may be derived therefrom by the person skilled in the art, without departing from the scope of protection of the invention.

The invention claimed is:

1. A method for producing an electronic component, the method comprising: forming a sacrificial structure on a top side of a carrier by a photolithographic process from a photoresist layer, wherein the photoresist layer is applied on the carrier and then the photoresist layer is exposed; arranging an electronic semiconductor chip on the carrier after exposing the photoresist layer; molding a molded body around the sacrificial structure and the electronic semiconductor chip such that a surface of the electronic semiconductor chip is at least partly not covered by the molded body; detaching the molded body from the carrier; and removing the sacrificial structure, wherein removing the sacrificial structure results in a cutout being formed in the molded body.

2. The method according to claim 1, wherein the electronic semiconductor chip is an optoelectronic semiconductor chip and the surface is an emission face of the optoelectronic semiconductor chip.

3. The method according to claim 1, further comprising applying an electrically conductive layer on at least one wall face of the cutout.

4. The method according to claim 3, further comprising arranging a connection element on the molded body, wherein the connection element electrically conductively connects the electrically conductive layer to a contact pad of the electronic semiconductor chip.

5. The method according to claim 1, further comprising severing the molded body and the cutout produced therein.

6. The method according to claim 1, wherein the cutout is formed such that it adjoins the surface of the electronic semiconductor chip.

7. The method according to claim 1, wherein, after forming the sacrificial structure on the top side of the carrier, the electronic semiconductor chip is arranged on a top side of the sacrificial structure, and wherein the surface of the electronic semiconductor chip faces the sacrificial structure.

8. The method according to claim 6, wherein the cutout is formed such that it adjoins a side face of the electronic semiconductor chip.

9. The method according to claim 8, wherein the sacrificial structure is formed by a photolithographic process from a photoresist system, which comprises the exposed photoresist layer as a first photoresist layer and a second photoresist layer, which is arranged on the first photoresist layer after having exposed the first photoresist layer, and wherein the electronic semiconductor chip is pressed into the second photoresist layer.

10. The method according to claim 6, further comprising introducing a potting compound into the cutout.

11. The method according to claim 1, wherein a peg is formed through the cutout on a first side face of the electronic component and a groove matching the peg is formed on a second side face of the electronic component.

12. The method according to claim 1, wherein the electronic component is produced together with further electronic components in a molded body assemblage, and wherein the method further comprises separating the electronic component from the further electronic components by dividing the molded body assemblage.

* * * * *